United States Patent
Son et al.

(10) Patent No.: US 7,320,908 B2
(45) Date of Patent: Jan. 22, 2008

(54) METHODS OF FORMING SEMICONDUCTOR DEVICES HAVING BURIED OXIDE PATTERNS

(75) Inventors: Yong-Hoon Son, Gyeonggi-do (KR);
Si-Young Choi, Gyeonggi-do (KR);
Byeong-Chan Lee, Gyeonggi-do (KR);
Jong-Wook Lee, Gyeonggi-do (KR);
In-Soo Jung, Gyeonggi-do (KR);
Deok-Hyung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 11/072,103

(22) Filed: Mar. 4, 2005

(65) Prior Publication Data
US 2005/0250279 A1   Nov. 10, 2005

(30) Foreign Application Priority Data
Mar. 5, 2004   (KR) .................... 10-2004-0015085

(51) Int. Cl.
*H01L 21/338* (2006.01)
(52) U.S. Cl. .................. 438/175; 438/700; 438/225
(58) Field of Classification Search ............... 438/151, 438/175, 197, 211, 265, 267, 303, 184, 230, 438/700, 225; 257/327
See application file for complete search history.

(56) References Cited

U.S. PATENT DOCUMENTS

| | | | |
|---|---|---|---|
| 5,620,912 A * | 4/1997 | Hwang et al. .............. 438/301 |
| 6,403,482 B1 | 6/2002 | Rovedo et al. |
| 6,642,090 B1 | 11/2003 | Fried et al. |
| 6,949,482 B2 * | 9/2005 | Murthy et al. .............. 438/739 |
| 6,989,570 B2 * | 1/2006 | Skotnicki et al. ........... 257/347 |
| 2002/0190344 A1 | 12/2002 | Michejda et al. |
| 2005/0012146 A1 * | 1/2005 | Murthy et al. .............. 257/336 |
| 2005/0224867 A1 * | 10/2005 | Huang et al. ............... 257/327 |

* cited by examiner

*Primary Examiner*—S. V. Clark
(74) *Attorney, Agent, or Firm*—Myers Bigel Sibley & Sajovec PA

(57) ABSTRACT

Methods for forming semiconductor devices are provided. A semiconductor substrate is etched such that the semiconductor substrate defines a trench and a preliminary active pattern. The trench has a floor and a sidewall. An insulating layer is provided on the floor and the sidewall of the trench and a spacer is formed on the insulating layer such that the spacer is on the sidewall of the trench and on a portion of the floor of the trench. The insulating layer is removed on the floor of the trench and beneath the spacer such that a portion of the floor of the trench is at least partially exposed, the spacer is spaced apart from the floor of the trench and a portion of the preliminary active pattern is partially exposed. A portion of the exposed portion of the preliminary active pattern is partially removed to provide an active pattern that defines a recessed portion beneath the spacer. A buried insulating layer is formed in the recessed portion of the active pattern. Related devices are also provided.

14 Claims, 31 Drawing Sheets

METHODS OF FORMING SEMICONDUCTOR DEVICES HAVING BURIED OXIDE PATTERNS

CLAIM OF PRIORITY

This application is related to and claims priority from Korean Patent Application No. 2004-15085 filed on Mar. 5, 2004, the disclosure of which are hereby incorporated herein by reference as if set forth in its entirety.

FIELD OF THE INVENTION

The present invention relates to methods of fabricating integrated circuit devices and related devices and, more particularly, to methods of isolating active regions of integrated circuit device and related devices.

BACKGROUND OF THE INVENTION

Recently, semiconductor devices have been designed to be highly integrated and operate at high speeds with a low driving voltage. In, for example, conventional metal oxide silicon field effect transistors (MOSFETs), high-speed operation of the semiconductor device requires a reduction in the length of the channel of the MOSFET. As the channel length of the MOSFET is reduced, an electric field caused by the drain voltage may negatively effect the channel region in the MOSFET and cause decreased reliability of the gate control due to the short channel effect. Furthermore, the reduction of the channel length may result in an increase of ion concentration in the channel region, and possibly cause a reduction of the carrier mobility in the channel region, thereby decreasing a driving current of the MOSFET. A leakage current may also be increased due to a decreased junction depth between a source region and a drain region of the MOSFET.

To address the problems with the MOSFETs discussed above, a silicon-on-insulator (SOI) substrate has been utilized for manufacturing semiconductor devices. An active region of the device is isolated from the SOI substrate. The SOI substrate typically includes bulk silicon. An insulating layer and an upper silicon layer are sequentially stacked on the substrate. A semiconductor device formed on the SOI substrate may provide a reduced junction capacitance and a driving current may be increased. However, the semiconductor device formed on the SOI substrate may also exhibit frequent variation of the threshold voltage due to non-uniformity of the upper silicon layer, a decrease of the driving current due to a self-heating effect caused by insulation from a lower portion of the substrate, and/or a floating channel effect.

To address the problems of semiconductor devices formed on the SOI substrate, buried oxide patterns may be formed under a surface of the substrate. This technique is discussed, for example, in U.S. Pat. No. 6,403,482 ('482), which discusses a transistor including the buried oxide pattern selectively formed under the source and drain contact regions. However, the process disclosed in the '482 patent exhibits a high contact resistance due to a reduction in a contact surface of the source and drain regions. Furthermore, a junction leakage current may not be efficiently prevented since the source and drain regions contact the well region.

Accordingly, a second method of addressing the problems discussed above with respect to semiconductor devices formed on SOI substrates has been proposed. In particular, the buried oxide pattern may be formed on an etched germanium layer. A silicon layer and a silicon germanium layer may be formed on the substrate using, for example, an epitaxial growth process, and the silicon germanium layer may be partially etched away. The buried oxide pattern is formed along the etched portion of the silicon germanium layer. However, the process using the epitaxial growth process typically requires a process change in subsequent processes. Furthermore, the epitaxial growth process may be costly, which may become a financial burden if the semiconductor device were to be mass produced. Accordingly, improved semiconductor devices providing decreased junction leakage currents and junction capacitances with a competitive manufacturing cost may be desired.

SUMMARY OF THE INVENTION

Some embodiments of the present invention provided methods for forming semiconductor devices. A semiconductor substrate is etched such that the semiconductor substrate defines a trench and a preliminary active pattern. The trench has a floor and a sidewall. An insulating layer is provided on the floor and the sidewall of the trench and a spacer is formed on the insulating layer such that the spacer is on the sidewall of the trench and on a portion of the floor of the trench. The insulating layer is removed on the floor of the trench and beneath the spacer such that a portion of the floor of the trench is at least partially exposed, the spacer is spaced apart from the floor of the trench and a portion of the preliminary active pattern is partially exposed. A portion of the exposed portion of the preliminary active pattern is partially removed to provide an active pattern that defines a recessed portion beneath the spacer. A buried insulating layer is formed in the recessed portion of the active pattern.

In further embodiments of the present invention, an upper surface of the preliminary active pattern has at least two different widths. Etching the semiconductor substrate may further define a body portion of the substrate beneath the trench and the active pattern. The active pattern may include a first region having a first width and a second region having a second width, greater than the first width. The buried insulating layer may isolates the first region of the active pattern from the body portion of the substrate and electrically couple the second region of the active pattern to the body portion of the substrate.

In still further embodiments of the present invention, the preliminary active pattern may have a first region and a second region. The second region may have a different width from the first region. A lower portion of the first region of the preliminary active pattern may be isotropically etched. The buried insulating layer may be formed using a thermal oxidation process or a chemical vapor deposition (CVD) process.

In some embodiments of the present invention, the semiconductor substrate maybe etched by forming a buffer insulating layer on the semiconductor substrate. A silicon nitride layer may be formed on the buffer insulating layer. A silicon nitride pattern may be formed exposing a field region by patterning the silicon nitride layer. The buffer insulating layer and the semiconductor substrate may be etched using the silicon nitride pattern as an etching mask to provide the trench and the preliminary active region.

In further embodiments of the present invention, the insulating layer may be removed by isotropically etching the insulating layer using the spacer as an etching mask to thereby expose at least a portion of the surface of the trench floor. The insulating layer may be formed by thermally oxidizing the substrate including the preliminary active pattern. The insulating layer may include silicon oxide. The spacer may include silicon nitride or a material having an etching rate lower than an etching rate of the insulating layer. In certain embodiments of the present invention, the preliminary active pattern may be partially removed using a chemical dry etching process.

While the present invention is described above primarily with reference to methods, devices are also provided herein.

BRIEF DESCRIPTION OF THE DRAWINGS

FIGS. 2A through 2I are cross sections illustrating processing steps in the fabrication of active regions according to some embodiments of the present invention.

FIG. 4 is a plan view illustrating active regions according to further embodiments of the present invention.

DETAILED DESCRIPTION OF EMBODIMENTS OF THE PRESENT INVENTION

Figure 1A:
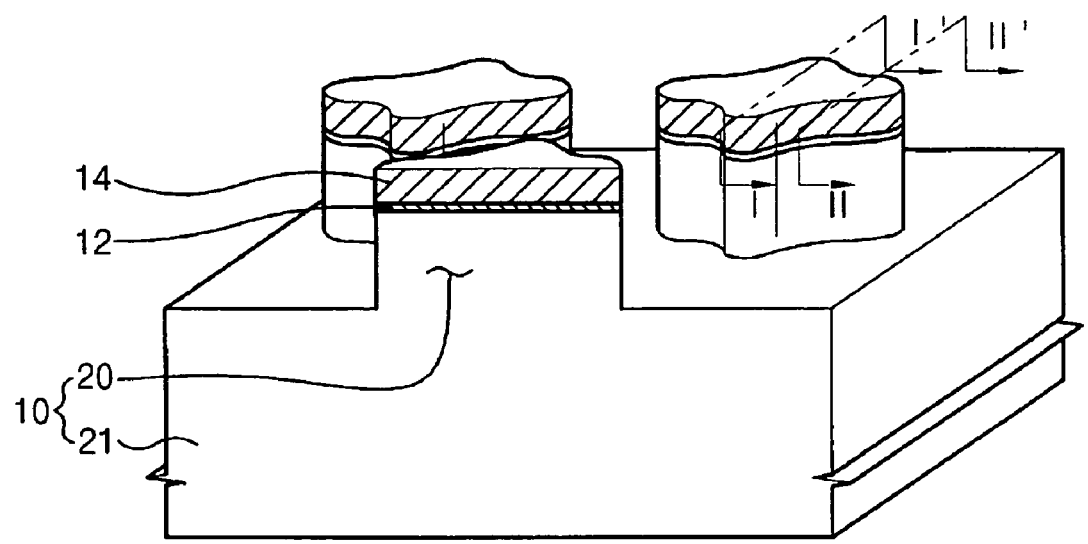
FIGS. 1A through 1I are perspective views illustrating processing steps in the fabrication of active regions according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIGS. 1A to 1I and FIGS. 2A through 2I. FIGS. 1A through 1I are perspective views illustrating processing steps in the fabrication of devices according to some embodiments of the present invention. FIGS. 2A to 2I are cross sections further illustrating processing steps in the fabrication of integrated circuit devices according to some embodiments of the present invention. In each of FIGS. 2A to 2I, a left portion of the cross section illustrates a cross section taken along the line I-I' of FIG. 1A and a right portion of the cross section illustrates a cross section taken along the line I-I" of FIG. 1A.

Figure 2A:
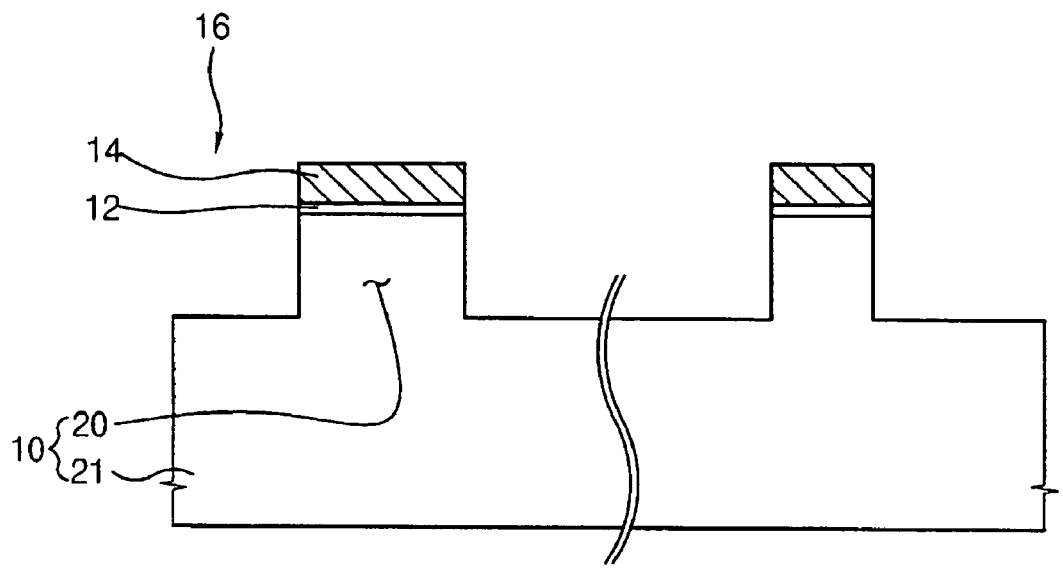

As illustrated in FIGS. 1A and 2A, a buffer insulating layer, for example, an oxide layer, is formed on a semiconductor substrate 10. The substrate 10 may be a bulk silicon substrate. A silicon nitride layer is formed on the buffer insulating layer. The buffer insulating layer may reduce the amount of a stress generated during the formation of the silicon nitride layer. The silicon nitride layer is partially removed using, for example, a dry-etching process in a conventional photolithography process, to thereby form a nitride pattern 14. The buffer insulating layer is continuously etched using the nitride pattern as an etching mask, exposing a surface of the substrate 10 and a buffer insulating pattern 12 is formed on the substrate 10. The exposed substrate 10 is etched using the nitride pattern as an etching mask such that the substrate 10 defines a trench 16. An anti-reflection layer (ARL)(not shown) may be formed on the silicon nitride layer to provide an improved processing margin of the photolithography process.

Figure 3:
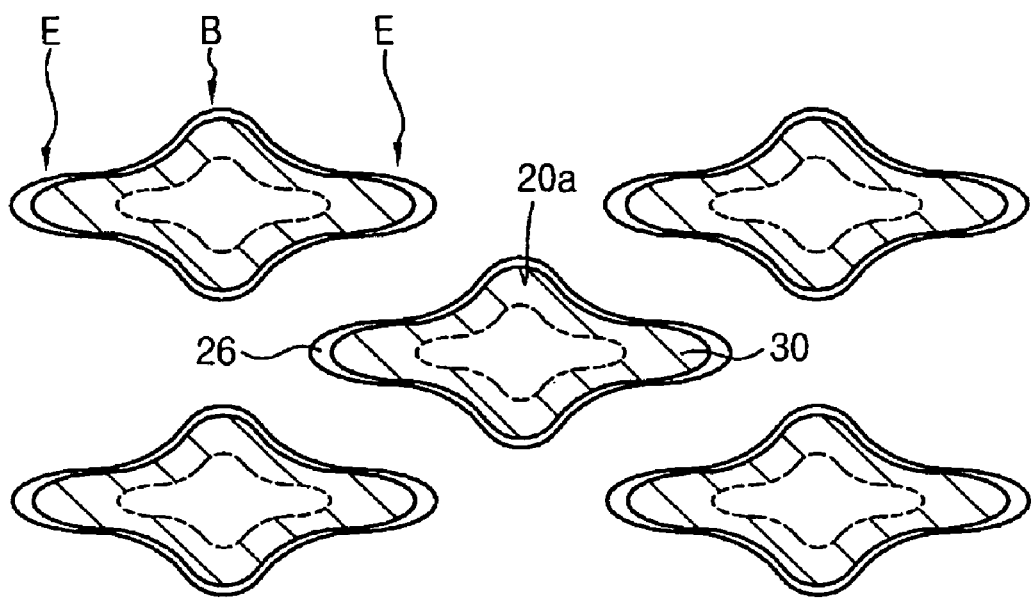
FIGS. 3 and 4 are plan views illustrating active regions according to some embodiments of the present invention.

After undergoing the photolithography process to form the trench 16, the substrate 10 has a convex portion and a concave portion. Hereinafter, the convex portion of the substrate 10 is referred to as a "preliminary active pattern" 20 and the concave portion corresponds to the trench 16. Furthermore, a portion of the substrate 10 under the trench 16 is referred to as a body of the substrate 10. In some embodiments of the present invention, an upper surface of the preliminary active pattern 20 is a plane and swollen at a central portion thereof. In other words, a top surface of the preliminary active pattern 20 is formed to a bulged shape as illustrated in FIG. 3.

Figure 1B:
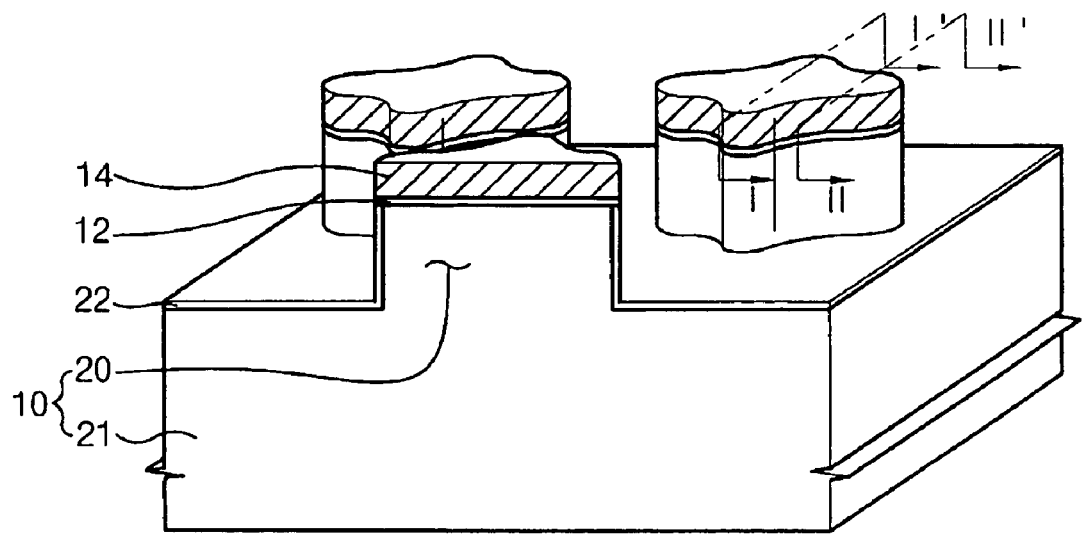
Figure 2B:
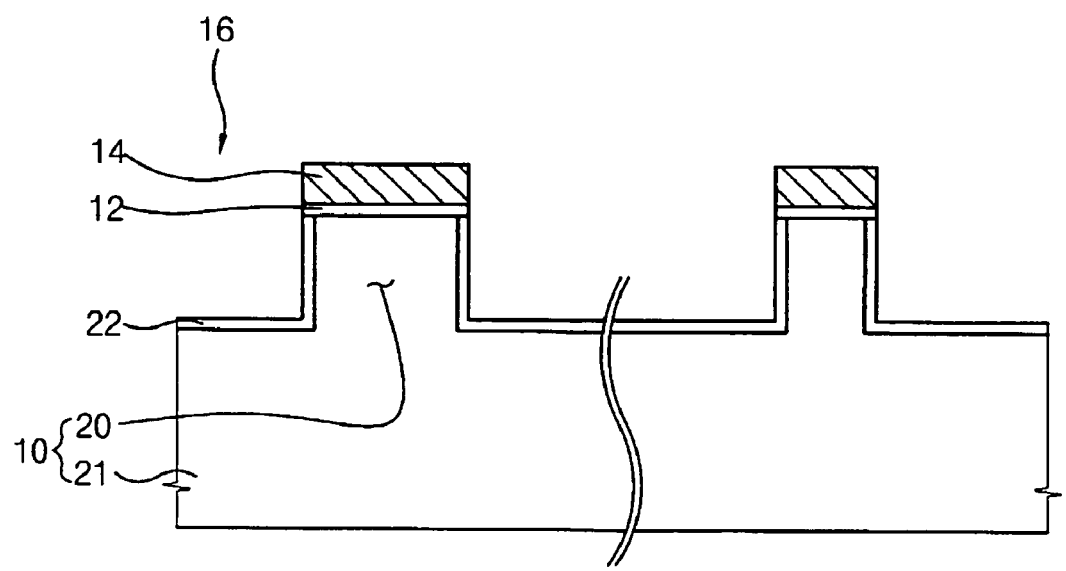

Referring now to FIGS. 1B and 2B, a heat treatment is performed on an inner surface of the trench 16 (trench floor and sidewall) in an oxidation atmosphere to cure any damage that may have occurred during formation of the trench 16. The silicon contained in the exposed inner surface of the trench 16 reacts with an oxidizing agent, and an inner oxide (insulating) layer 22 is formed on the inner surface of the trench 16.

Figure 1C:
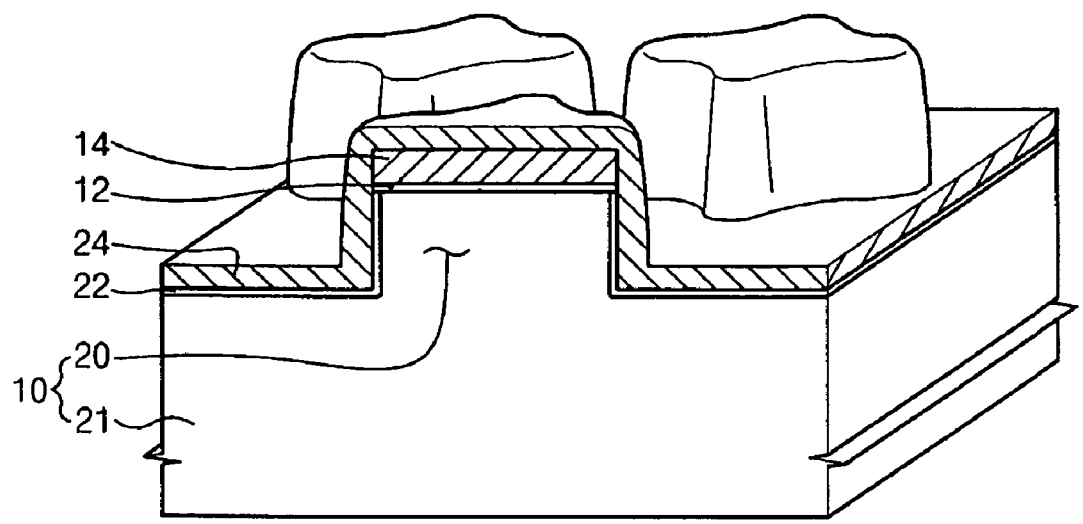
Figure 2C:
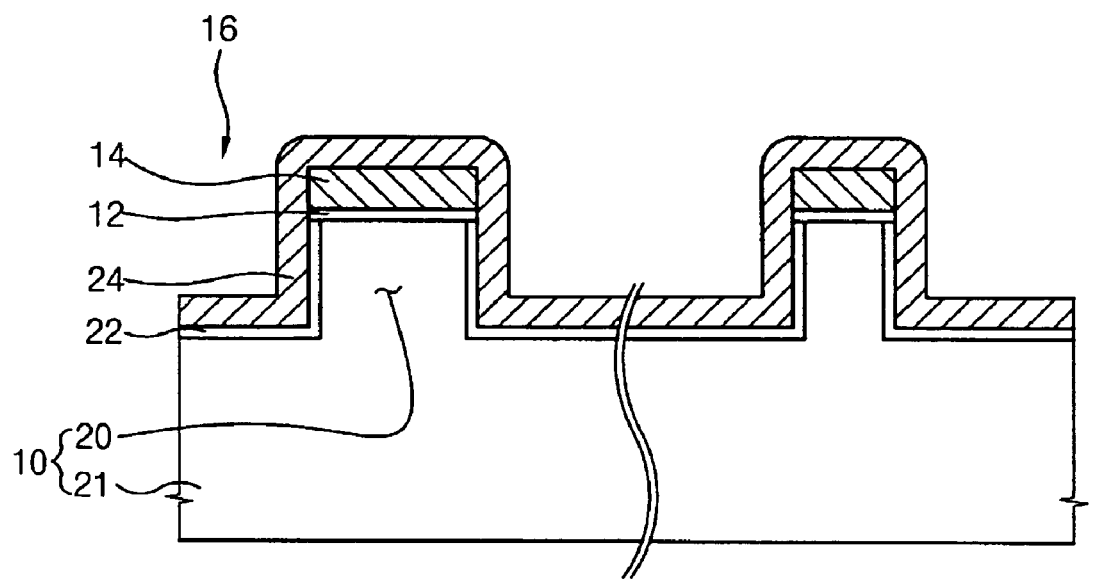

Referring now to FIGS. 1C and 2C, a liner 24 including, for example, silicon nitride, is formed on the inner side surface of the trench 16 and on side and upper surfaces of the silicon nitride pattern 14 using, for example, a chemical vapor deposition (CVD) process. In some embodiments of the present invention, the liner 24 may include a material having an etching rate greater than that of the inner oxide layer 22. The liner 24 may reduce the amount of oxygen ($O_2$) that penetrates the inner surface of the trench 16 in a subsequent oxidation process. Accordingly, no more or very little oxygen may be generated on the inner surface of the trench 16 in a subsequent process.

Figure 1D:
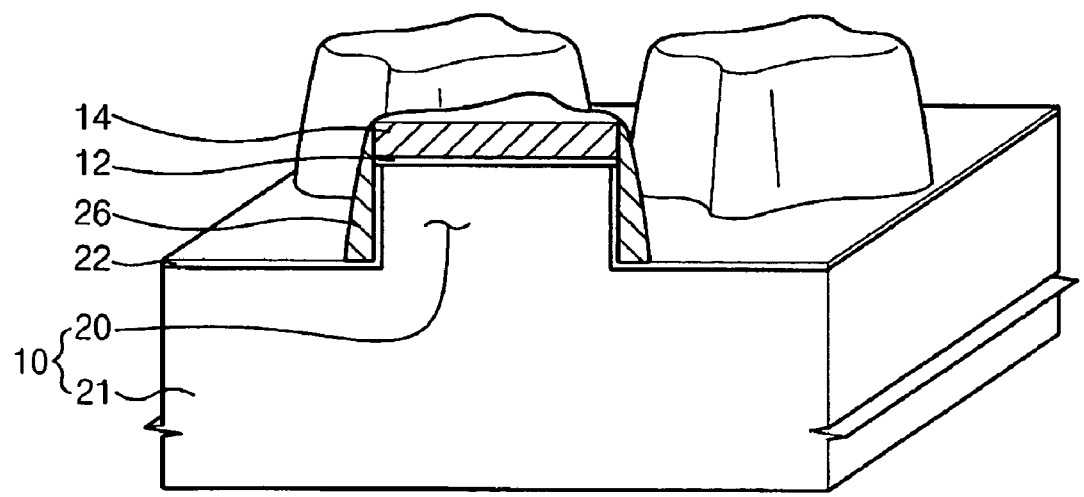
Figure 2D:
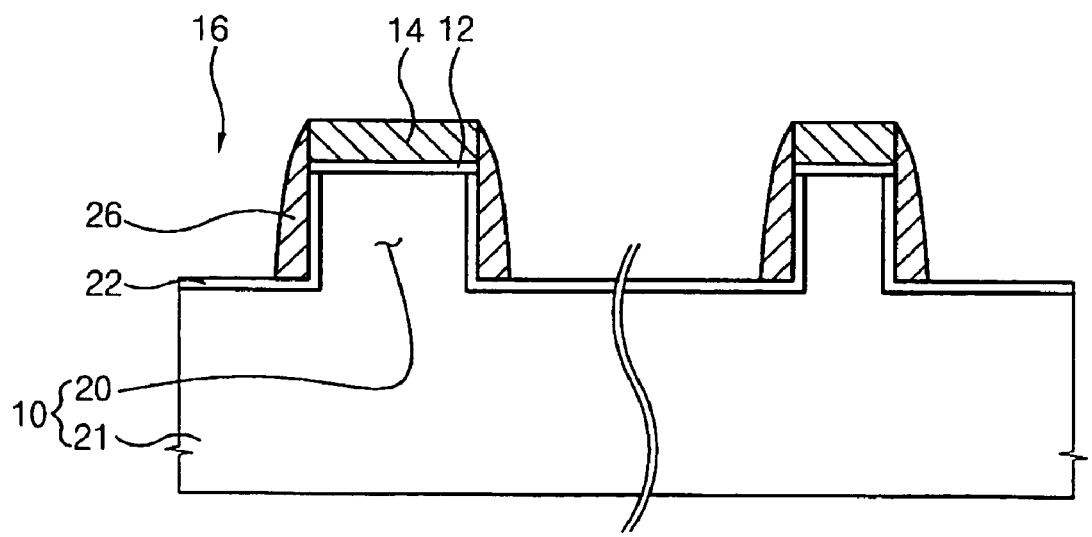

Referring now to FIGS. 1D and 2D, the liner 24 is anisotropically etched until at least a portion of the inner oxide layer 22 on the floor of the trench 16 is exposed forming a nitride spacer 26 on a sidewall of the silicon nitride pattern 14, the buffer insulating pattern 12 and the sidewall of the trench 16. Accordingly, a nitride-based layer is formed on an outer surface of the preliminary active pattern 20. In other words, the silicon nitride layer 14 is provided on an upper surface of the preliminary active pattern 20 and the nitride spacer 26 is provided on the side surface of the preliminary active pattern.

Figure 1E:
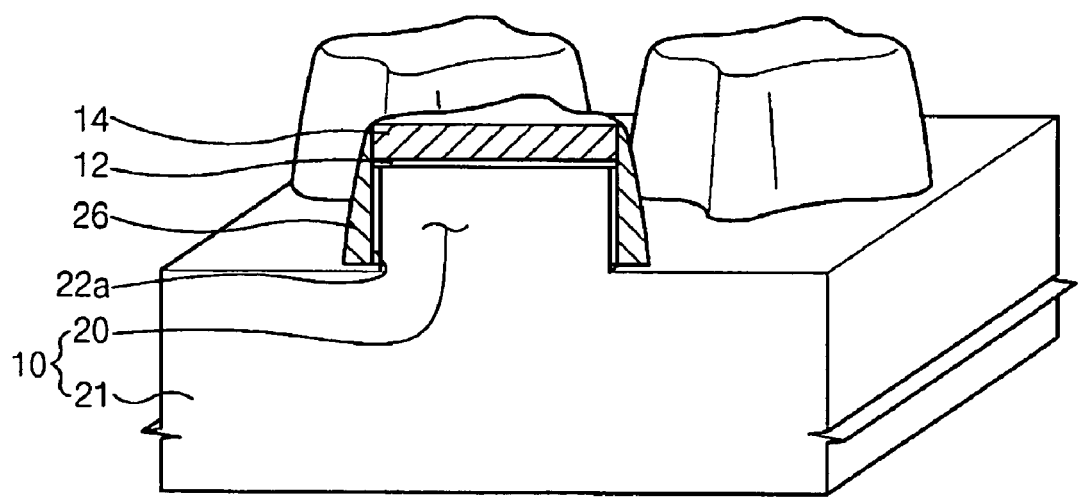
Figure 2E:
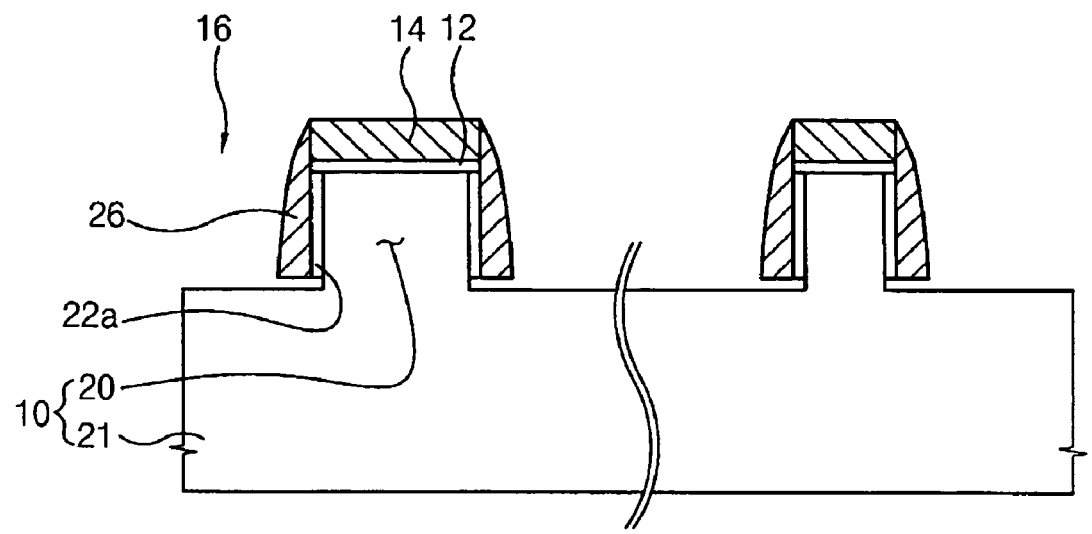

Referring now to FIGS. 1E and 2E, the inner oxide layer 22 on the floor of the trench 16 is removed using, for example, an isotropic etching process. As illustrated, the isotropic property of the etching process removes the inner oxide layer 22 under the nitride spacer 26, thus, the nitride spacer 26 is spaced apart from the floor of the trench 16 by a distance corresponding to a thickness of the inner oxide layer 22. Accordingly, a surface of the substrate 10 is exposed in the trench 16 and a lower portion of the side surface of the preliminary active pattern 20 is also exposed.

Figure 1F:
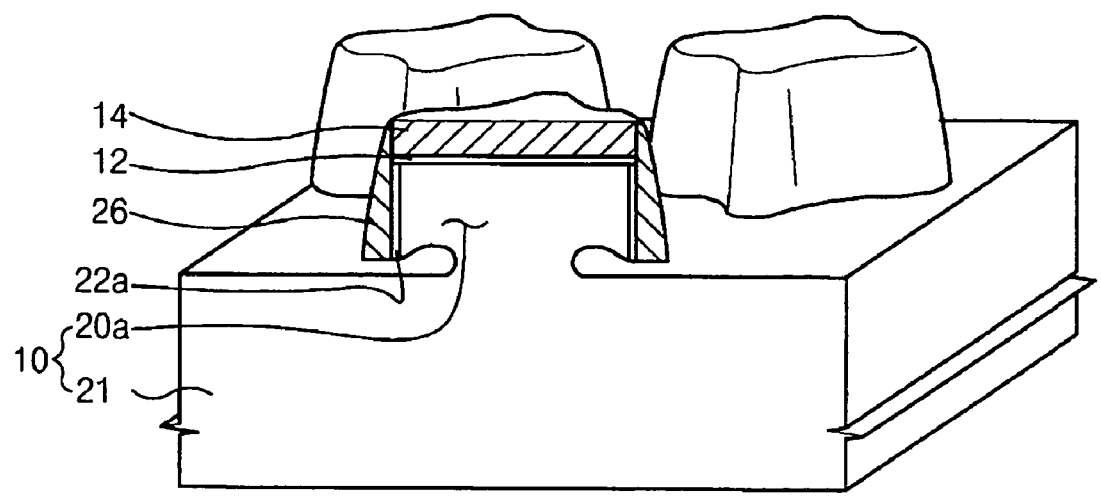
Figure 2F:
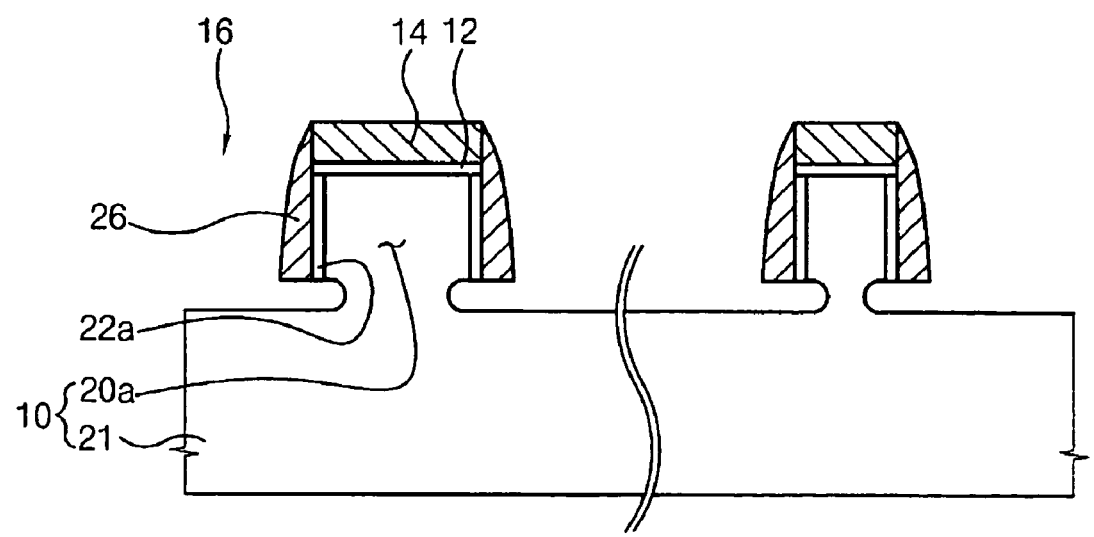

Referring now to FIGS. 1F and 2F, an isotropic etching process is performed in the trench 16 etching portions of the surface of the substrate 10 and the exposed side surface of the preliminary active pattern 20 at about the same rate, such that the preliminary active pattern 20 is partially removed at a lower portion thereof. At the completion of the isotropic etching process, the preliminary active pattern 20 is formed into an active pattern 20a having a recessed portion at the lower portion thereof. In some embodiments of the present invention, the isotropic etching process may be a chemical dry etching (CDE) process. Furthermore, it will be understood by those having skill in the art that the isotropic etching process may be omitted when a lower side surface of the active pattern 20a is sufficiently exposed during a previous process.

Figure 1G:
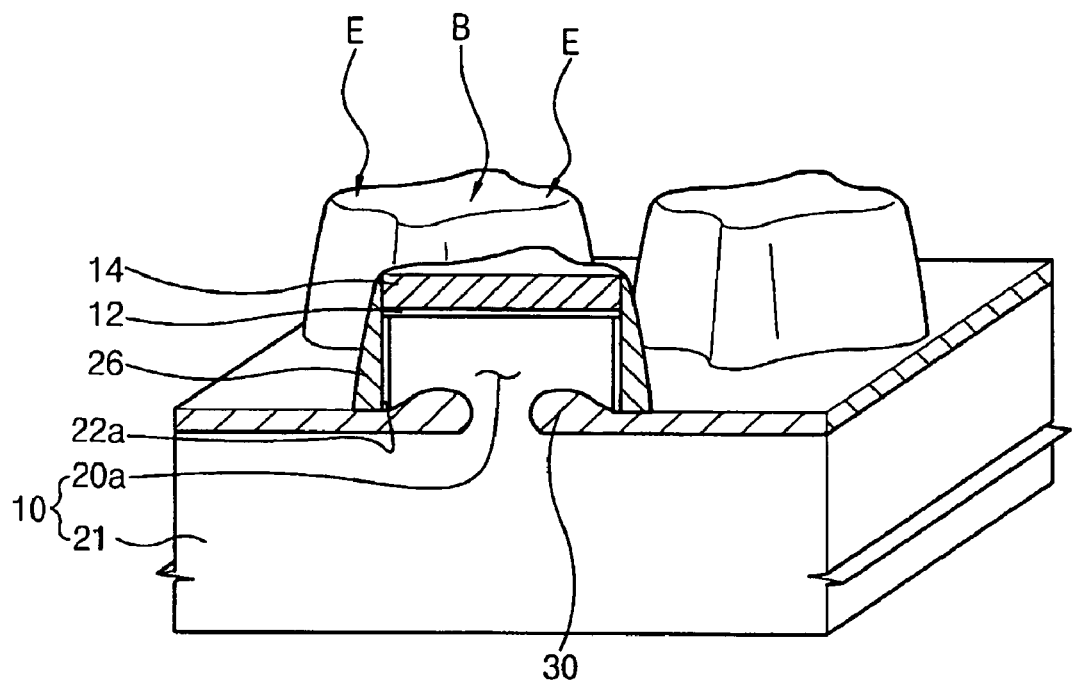
Figure 2G:
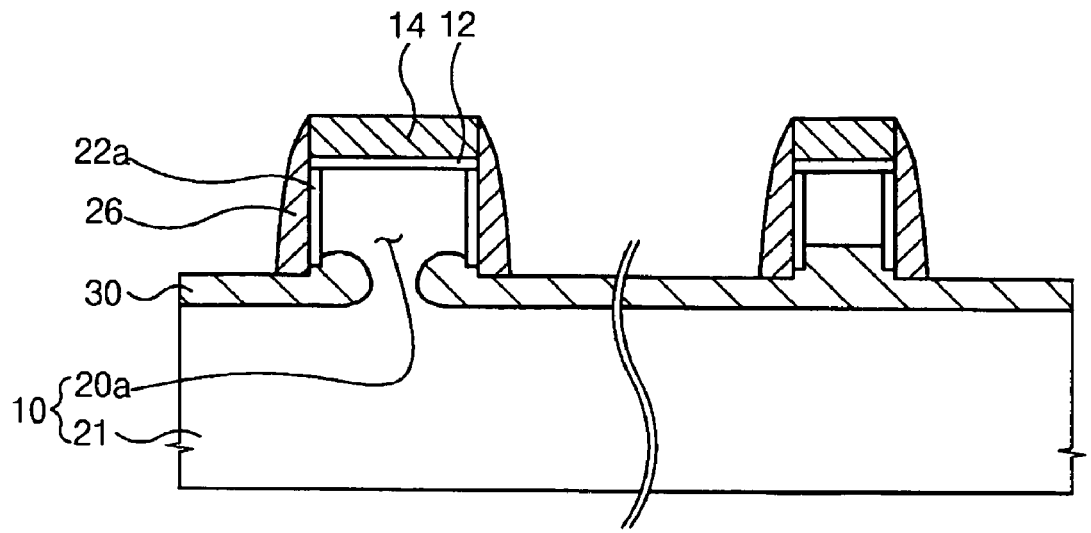

Referring now to FIGS. 1G and 2G, the substrate 10 at the bottom surface of the trench 16 and at the lower portion of the active pattern 20a is thermally oxidized forming a buried insulating pattern 30, for example, a buried oxide pattern 30, at the bottom surface of the trench 16 and at the lower portion of the active pattern 20a. The active pattern 20a has at least two widths, a first of the at least two widths being different from a second of the at least two widths. For example, the active pattern 20a includes a first region having a first width and a second region having a second width, greater than the first width. In some embodiments of the present invention, an upper surface of the active pattern 20a has a bulged shape as discussed above, such that a width of the bulged portion of the active pattern 20a is greater than widths of the end portions. In other words, the first region has a relatively small width, which corresponds to the end portions E of the active pattern 20a and the second region has a relatively large width, which corresponds to the bulged portion B of the active pattern 20a.

A lower portion of the first region E is completely oxidized and the buried insulating pattern 30 is sufficiently formed under the first region E, so that the active pattern 20a is fully isolated from the body portion 21 of the substrate 10 at the first region E. A lower portion of the second region B is partially oxidized and the buried insulating pattern 30 is not completely formed under the second region B, so that the active pattern 20a makes contact with the body portion 21 of the substrate 10 under the second region B. The variation on the conditions of the thermal oxidation process causes the buried oxide pattern 30 to partially make contact with the body portion 21 of the substrate 10 at the edge portions of the active pattern 20a.

In some embodiments of the present invention, the buried insulating pattern 30 may be formed using, for example, a chemical vapor deposition (CVD) process. When the CVD process is utilized for the buried oxide pattern, an isotropic etching process is necessarily performed on the substrate 10 and the active pattern 20a has recessed portions at a lower portion thereof. A first region of the active pattern is spaced apart from the body portion of the substrate 10 by a predetermined distance, and the second portion of the active pattern makes contact with the body portion of the substrate 10.

Figure 1H:
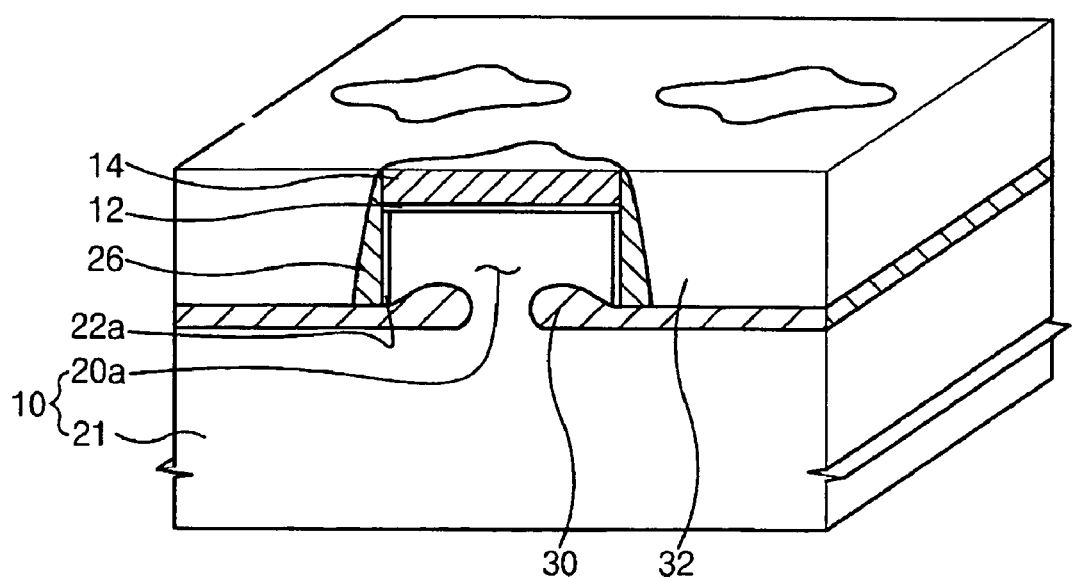
Figure 2H:
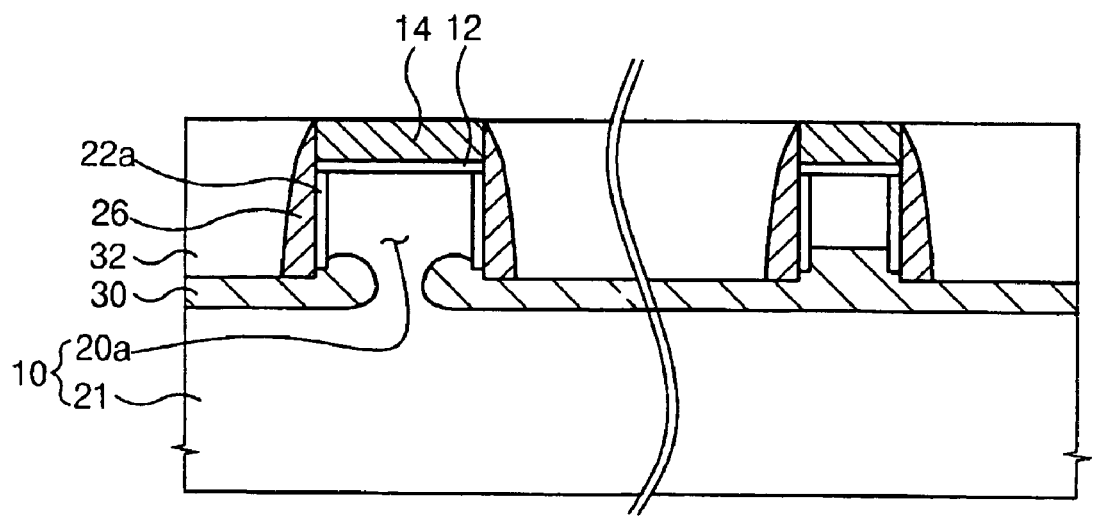
Figure 21:
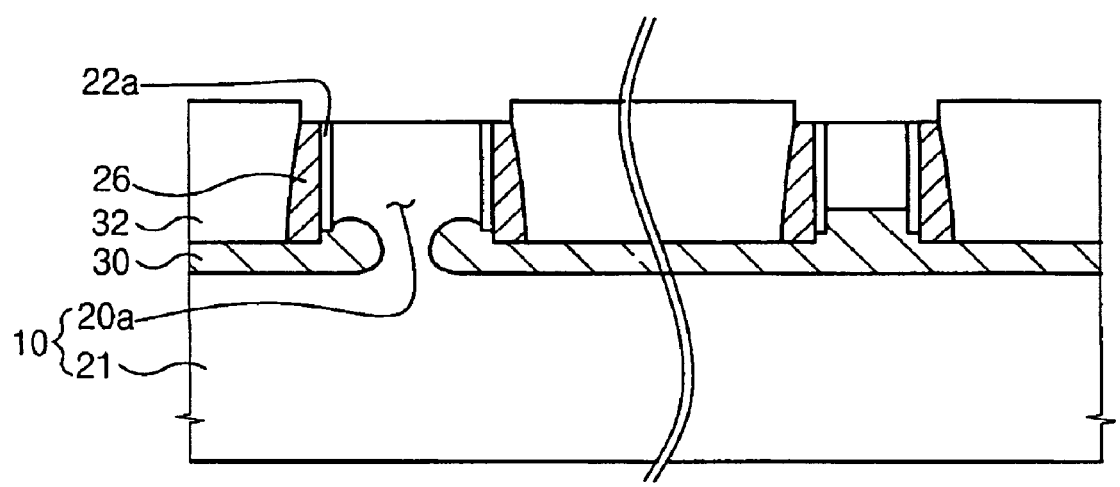

Referring now to FIGS. 1H and 2H, an oxide having excellent gap-filling characteristics is deposited on the substrate 10 in the trench 16 using, for example, a CVD process, so that a trench oxide layer 32 is formed on the substrate 10. For example, in some embodiments of the present invention the trench oxide layer may include an undoped silicate glass (USG) layer, ozone-tetraethylorthosilicate USG (O3-TEOS USG) layer or an oxide layer formed by a high-density plasma CVD (HDPCVD) method.

The trench oxide layer 32 is removed and planarized using, for example, a CMP process or an etch-back process, until at least a portion of an upper surface of the nitride pattern 14 is exposed, so that the trench oxide layer 32 remains in the trench 16. In some embodiments of the present embodiment, the CMP process may be utilized for planarizing the trench oxide layer 32.

Figure 1I:
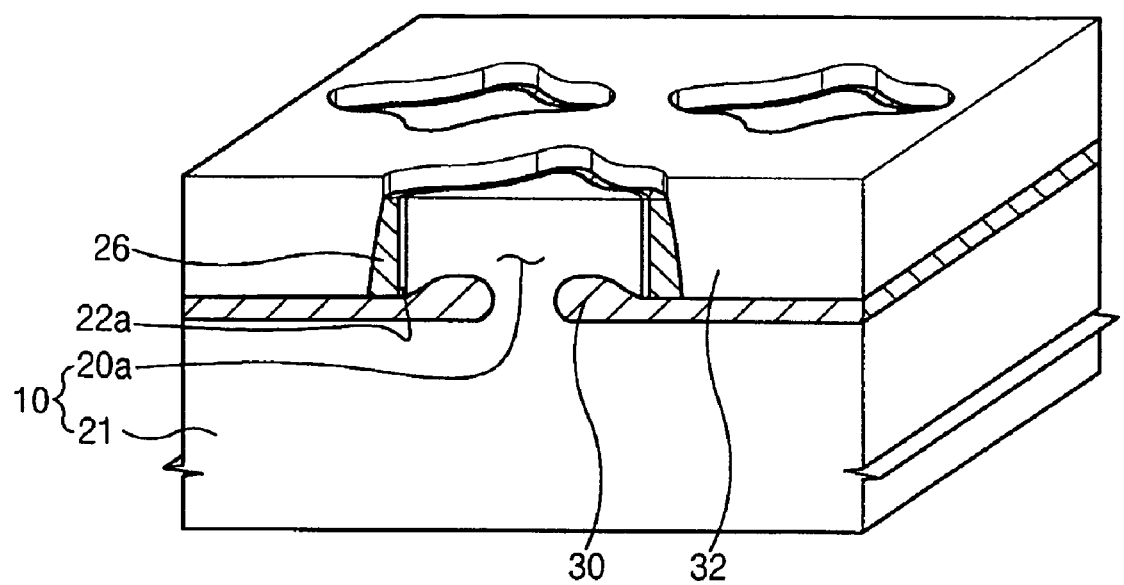

Referring now to FIGS. 1I and 2I, a first wet etching process is performed using a nitride-based etchant such as an aqueous phosphoric acid solution to remove the nitride pattern 14. A second wet etching process is performed using an oxide-based etchant such as an aqueous hydrofluoric acid solution to remove the buffer insulating pattern 12. Accordingly, the field region and the active region are separated from each other on the substrate 10.

Referring now to FIG. 3, a plan view illustrating devices according to embodiments of the present invention discussed above with respect to FIGS. 1A through 2I will be discussed. As illustrated in FIG. 3, the active region formed using the processing steps discussed above with respect to FIGS. 1A to 2I includes the active pattern 20a, the nitride spacer 26 and the buried oxide layer 30 at the lower portion thereof. In some embodiments of the present invention, an upper surface of the active region has a bulged shape, and thus the active pattern 20a includes a first region E having a first width and a second region B having a second width, greater than the first width. In other words, the first region E is around end portions of the active pattern 20a and the second region B is around bulged portion of the active pattern 20a at a central portion thereof.

The buried insulating pattern is provided on a lower portion of the first region E such that the active pattern 20a is sufficiently isolated from the body portion of the substrate. The buried insulating pattern 30 does not extend to a central portion of the active pattern 20a, and a lower portion of the second region B is not covered with the buried insulating pattern 30. Accordingly, the active pattern 20a makes contact with the body portion of the substrate at the second region B.

Accordingly, semiconductor devices provided on active patterns discussed above are isolated from the body portion of the substrate under an edge portion thereof, thus devices formed on such active regions may have an advantage over conventional devices. For example, devices according to some embodiments of the present invention may have reduced junction capacitance and junction leakage current and increased driving currents. Furthermore, the semiconductor device on the active pattern also makes contact with the body portion of the substrate under a central portion thereof, thus the self-heating effect may be significantly reduced.

Figure 4:
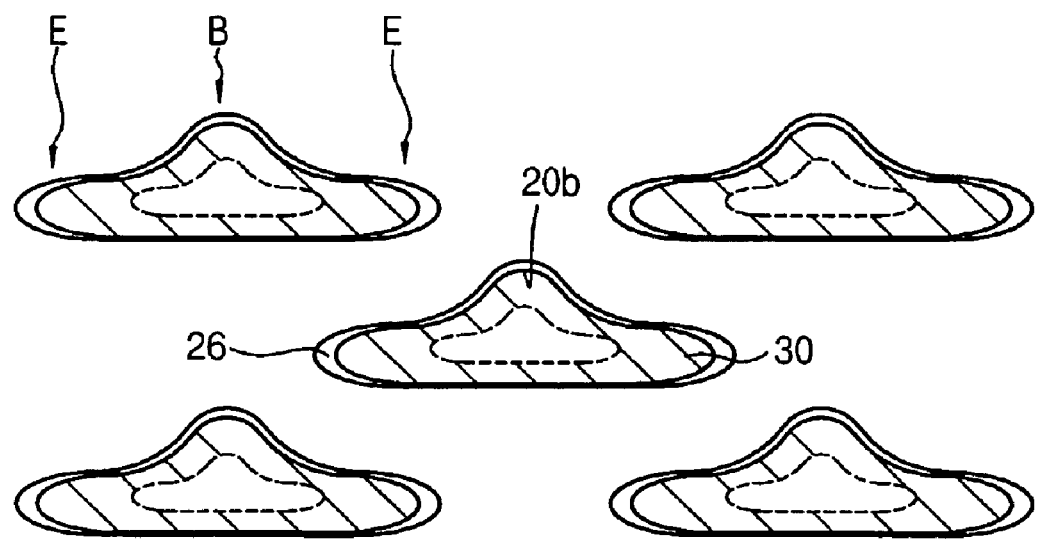

Referring now to FIG. 4, a plan view illustrating the active region according to further embodiments of the present invention will be discussed. The active region illustrated in FIG. 4 is similar to the active region discussed above with respect to FIGS. 1A through 3, except it is shaped differently. Thus, the processing steps for forming the active region in FIG. 4 are the same as the processing steps discussed above with respect to FIGS. 1A through 3, except for a masking step for forming the shape of the active pattern in FIG. 4. Accordingly, like reference numerals in FIG. 4 denote the same elements in FIGS. 1A to 3, and thus detailed descriptions of these elements will not be discussed in further detail herein.

As illustrated in FIG. 4, the active region according to some embodiments of the present invention includes a modified active pattern 20b, a nitride spacer 26 and a buried insulating layer 30 at a lower portion thereof. In embodiments of the present invention illustrated in FIG. 4, an upper surface of the active region has a bulged shape at a lateral portion thereof and a flat shape at the other lateral portion thereof. Thus, the active region 20b of FIG. 4 also includes a first region E having a first width and a second region B having a second width, greater than the first width. Around end portions of the modified active pattern 20b, there is the first region E and around bulged portion of the modified active pattern 20b at a central portion thereof, there is the second region B.

The buried insulating pattern 30 is provided on a lower portion of the first region E is such that the active pattern 20b is sufficiently isolated from a body portion 21 of a substrate 10. The buried insulating pattern 30 does not extend to a central portion of the active pattern 20b, and the buried insulating pattern 30 is not provided on a lower portion of the second region B. Accordingly, the active pattern 20b makes contact with the body portion 21 of the substrate 10 at the second region B.

It will be understood that although embodiments of the present invention are discussed above as having an active pattern with first and second different widths, embodiments of the present invention are not limited to this configuration. For example, more than two different widths may be formed on the active pattern without departing from the scope of the present invention.

Figure 5A:
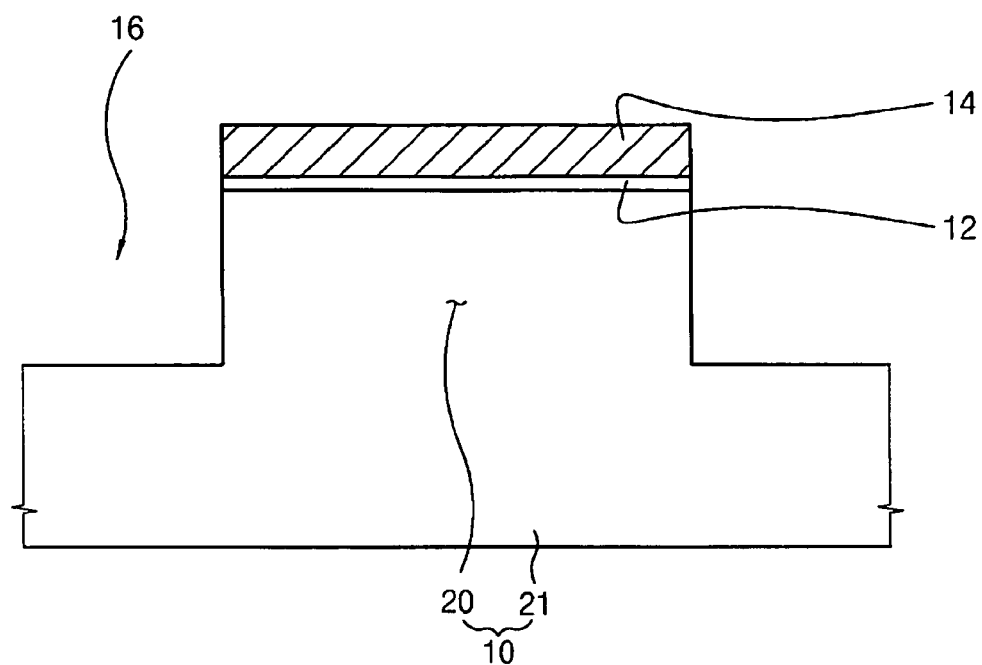
FIGS. 5A through 5G are cross sections illustrating processing steps in the fabrication of cell transistors according to some embodiments of the present invention.

Referring now to FIGS. 5A to 5G, cross sections illustrating processing steps in the fabrication of semiconductor devices according to some embodiments of the present invention will be discussed. As illustrated in FIG. 5A, a buffer insulating layer is formed on a substrate 10, for example, a bulk silicon substrate, and a silicon nitride layer is formed on the buffer insulating layer. The buffer insulating layer may reduce an amount of stress generated during formation of the silicon nitride layer.

The nitride layer is dry-etched using, for example, a photolithography process to thereby form a nitride pattern 14, and the buffer insulating layer is also dry-etched using the nitride pattern 14 as an etching mask to thereby form a buffer insulating pattern 12 through which a surface of the substrate 10 is partially exposed. The exposed portion of the substrate 10 is etched using the nitride pattern 14 as an etching mask to thereby form a trench 16. In some embodiments of the present invention, the trench 16 is formed to be deeper than the source and drain regions of the transistor formed in a subsequent process, which will be discussed below. In these embodiments of the present invention, the trench may be shallower than a conventional device isolation trench structure. In certain embodiments of the present invention, an anti-reflection layer (ARL)(not shown) may be formed on the nitride layer, which may improve a processing margin of the photolithography process.

A convex portion and a concave portion are formed on the substrate 10 after the photolithography process for forming the trench 16 is completed. As stated above, hereinafter, the convex portion of the substrate 10 is referred to as a preliminary active pattern, and the concave portion corresponds to the trench 16. A portion of the substrate 10 under the trench 16 is referred to as a body of the substrate 10.

In some embodiments of the present invention, the transistor may be, for example, a dynamic random access memory (DRAM). In these embodiments of the present invention, a bit line and a capacitor are electrically coupled to the source and the drain regions of the transistor, respectively. The bit line and the capacitor should be connected without overlapping each other.

A pair of cell transistors is formed on the active pattern of the DRAM, and the capacitor is connected to a first doped region corresponding to both lateral portions of the active pattern. The bit line is connected to a second doped region corresponding to a central portion of the active pattern. The second doped region is connected in common with the pair of the cell transistors. The first and second doped regions will be described further below.

An upper surface of the preliminary active pattern 20 has at least two widths, a first of the widths being different from a second of the widths, which may reduce the likelihood that the bit line and the capacitor will overlap with each other. In some embodiments of the present invention, the preliminary active pattern 20 has an increased width at a central portion thereof corresponding to the second doped region of the active pattern. The preliminary active pattern 20 has a plain top surface and a bulged shape as described in the first embodiment of the present invention, thus the width of the preliminary active pattern 20 is relatively large at the bulged portion.

Figure 5B:
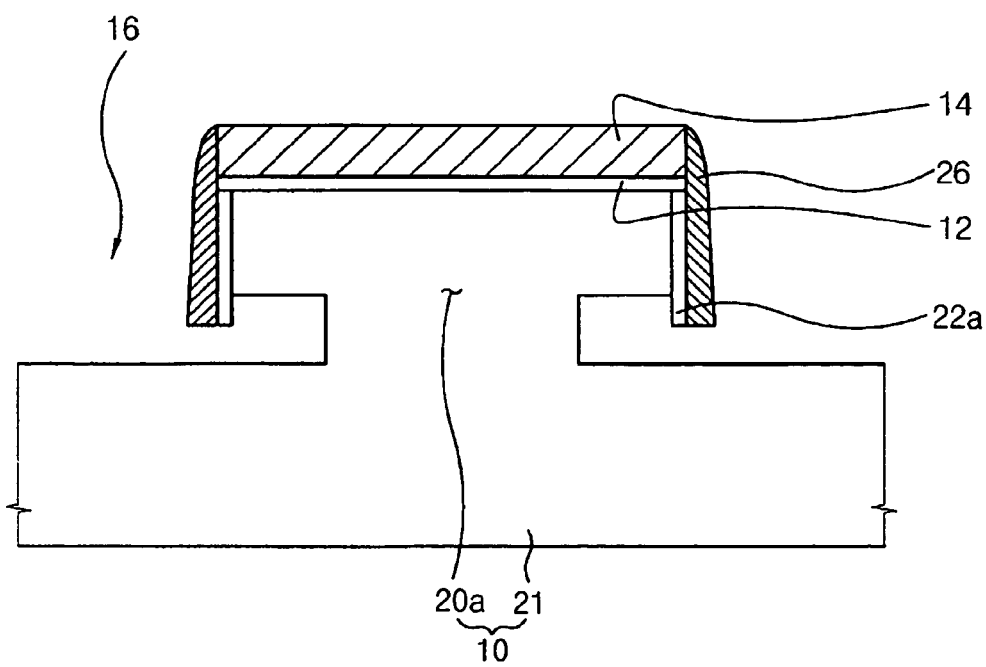

Referring now to FIG. 5B, a lower edge portion of the preliminary active pattern 20 is removed using processing steps similar to those described with reference to FIGS. 1B through 1F. Thus, the preliminary active pattern 20 is etched to form an active pattern 20a having a recessed portion at a lower portion thereof. The substrate 10 exposed through the trench 16 is further uniformly etched away during the removal process, so that the trench 16 may have a sufficient depth corresponding to the conventional device isolation trench structure even though the depth of the trench 16 is shallower than that of the conventional device isolation trench structure.

Figure 5C:
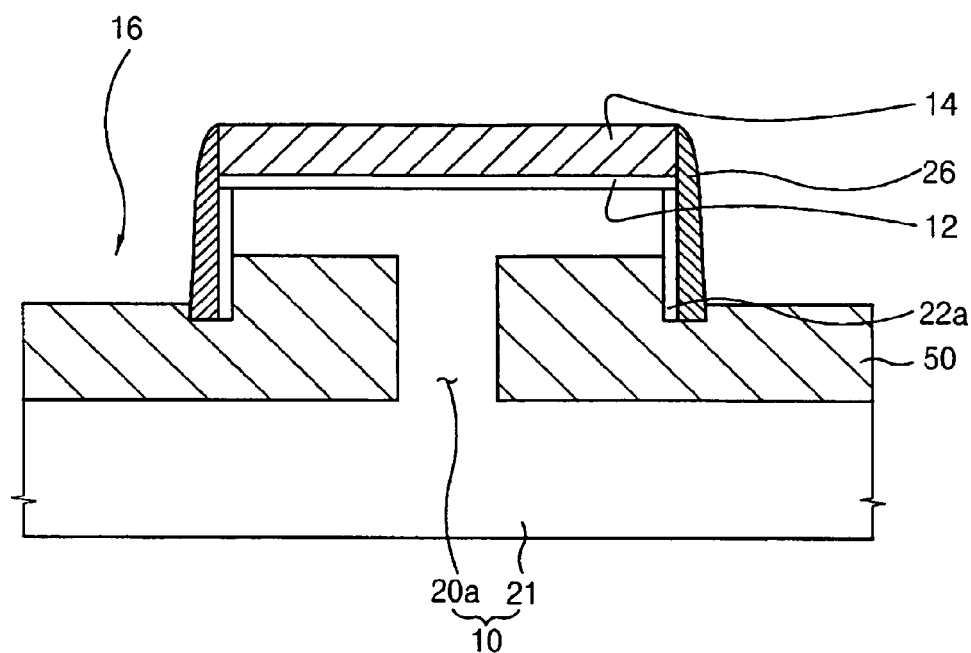

Referring now to FIG. 5C, the portion of the substrate exposed through the active pattern 20a and the trench 16 is thermally oxidized, and a buried insulating layer 50, for example, a buried oxide pattern, is formed toward an inside of the active pattern 20a at a lower portion thereof. The buried insulating pattern 50 extends to the first region of the active pattern 20a to which the capacitor is connected and a channel region from the lower edge portion of the active pattern 20a.

In some embodiments of the present invention, the active pattern 20a has a relatively large width in the second region to which the bit line is connected and has a relatively small width in the first region to which the capacitor is connected. Accordingly, the substrate 10 is completely oxidized at a lower portion of the first region, thus the first region of the active pattern 20a is isolated from the body portion 21 of the substrate 10. Furthermore, the substrate is completely oxidized at a lower portion of the channel region between the first and second regions, thus, the channel region is also isolated from the body portion 21 of the substrate 10. The substrate is partially oxidized at a lower portion of the second region, thus the second region of the active pattern 20a is electrically connected to the body portion 21 of the substrate 10. Processing steps for completion of the active structure including the active pattern and the buried insulating pattern formed on a lower side surface of the active pattern are similar to those described above.

Figure 5D:
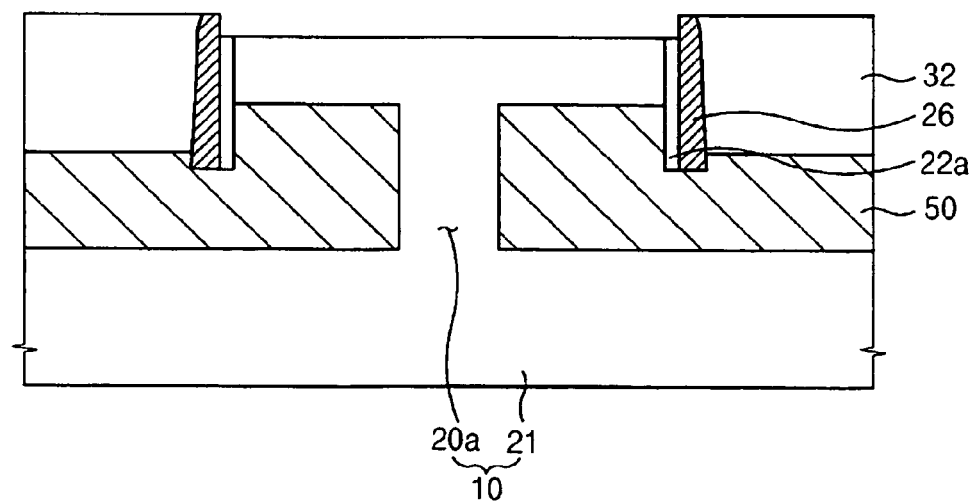

Referring now to FIG. 5D, an oxide having excellent gap-fill characteristic is deposited on the substrate 10 in the trench 16 using, for example, a CVD method, so that a trench oxide layer 32 is formed on the substrate 10. The trench oxide layer 32 is removed and planarized using, for example, a CMP process or an etch-back process until a top surface of the nitride pattern 14 is at least partially exposed, so that the trench oxide layer 32 remains in the trench 16. A first wet etching process is performed using a nitride-based etchant to thereby remove the nitride pattern 14. A second wet etching process is performed using an oxide-based etchant to thereby remove the buffer oxide pattern 12. Accordingly, the field region and the active region are separated from each other on the substrate 10.

Figure 5E:
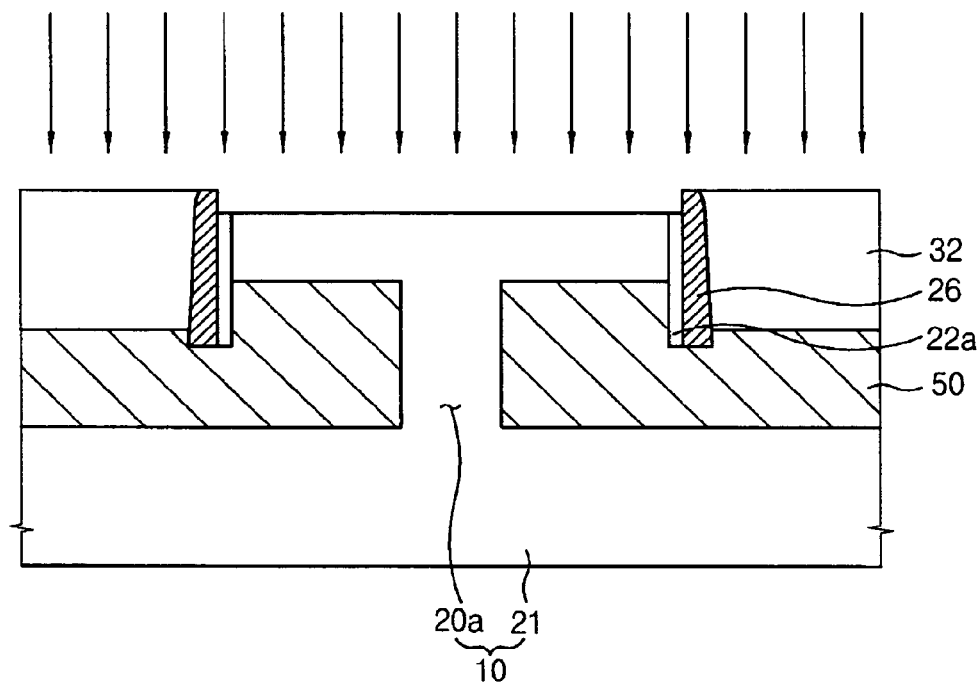

Referring now to FIG. 5E, a damage prevention oxide layer (not shown) is formed on the substrate 10 including the active region and the field region to reduce the likelihood that the substrate may be damaged during a subsequent implantation process. Impurities are implanted onto the substrate for controlling a threshold voltage of the transistor. When the cell transistor of the DRAM is an N-channel metal oxide semiconductor (NMOS) transistor, P type dopants may be implanted onto the substrate.

The buried insulating pattern 50 is formed at the lower portion of the first region and the channel region of the active pattern 20a, so that the active pattern 20a is isolated from the body portion 21 of the substrate 10. Therefore, the junction leakage current may be reduced in the cell transistor according to some embodiments of the present invention. The P type dopants may be more heavily implanted when the dopants are implanted in the substrate 10 for controlling the threshold voltage. The P type dopants may include, for example, boron (B) or boron difluoride ($B_{F2}$), and may be implanted at a concentration of at least about $10^{13}/cm^2$ or more. When the channel region is heavily implanted as described above, the short channel effect of the cell transistor may be improved. The damage prevention oxide layer is removed after the dopants are implanted in the substrate 10.

Figure 5F:
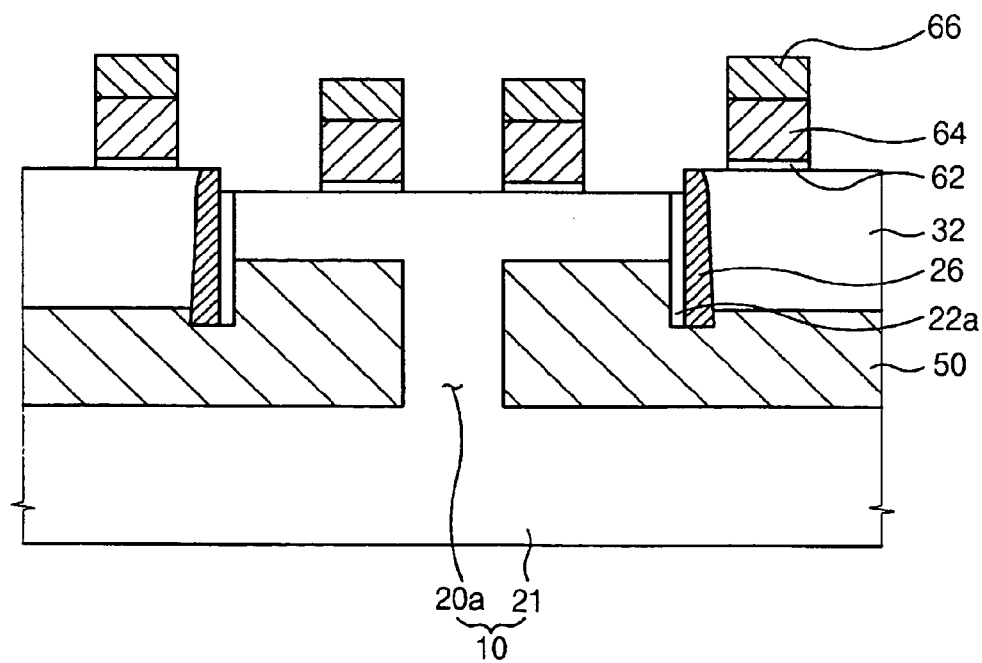

Referring now to FIG. 5F, a gate insulating layer is formed on the substrate 10 including the channel region. A gate electrode layer and the hard mask layer are sequentially formed on the gate insulating layer. The hard mask layer is partially removed using, for example, a conventional photolithography process to thereby form a hard mask 66, and the gate electrode layer and the gate insulating layer are sequentially etched using the hard mask as an etching mask. Accordingly, a gate structure is formed including a gate insulation pattern 62, a gate electrode pattern 64 and a hard mask 66.

Figure 5G:
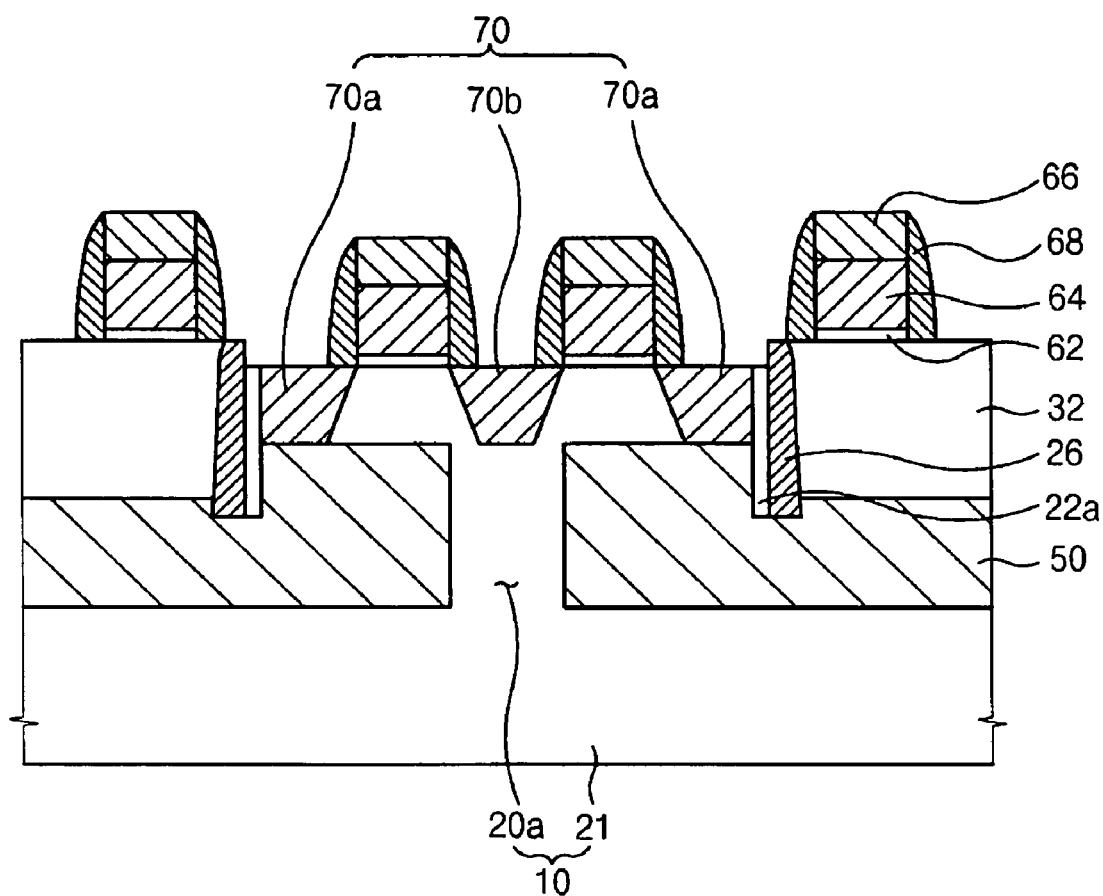
Figure 6:
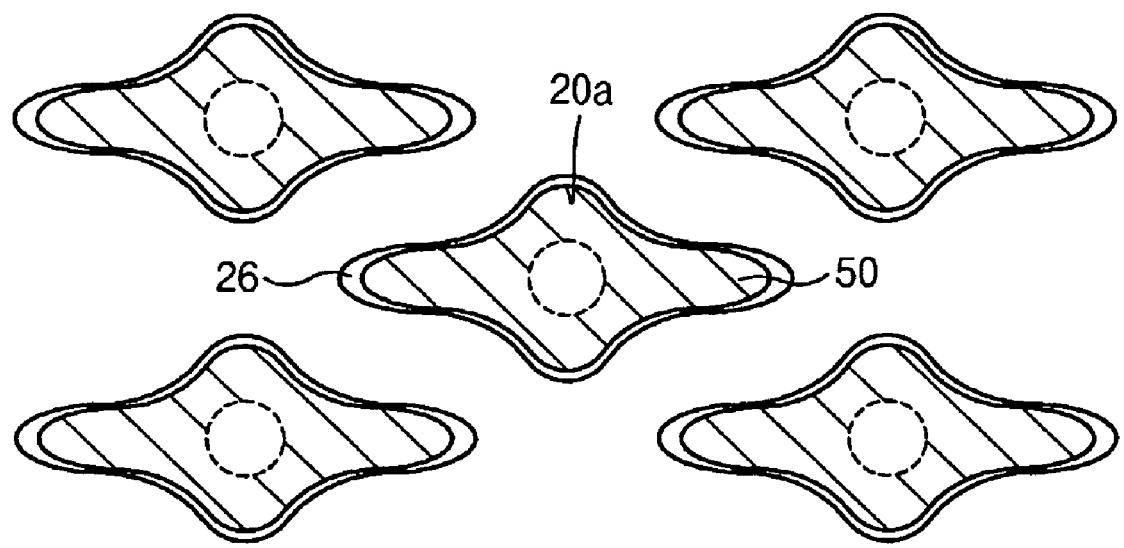
FIG. 6 is a plan view illustrating active regions of cell transistors according to some embodiments of the present invention.

Referring now to FIGS. 5G and 6, (FIG. 6 is a plan view illustrating active regions of cell transistors according to some embodiments of the present invention), a silicon nitride layer is formed on the substrate 10, and an anisotropic etching process is performed on the silicon nitride layer. A gate spacer 68 is formed on side surfaces of the gate structure. Dopants are implanted onto surface portions of the substrate using the gate structure as an implantation mask to thereby form source and drain regions 70 of the transistor. The source and drain regions 70 of the transistor include a first doped region 70a to which a capacitor is connected and a second doped region 70b to which a bit line is connected.

In some embodiments of the present invention, the first doped region 70a is extended to the upper surface of the buried insulating pattern 50, so that the junction capacitance between the source and drain regions 70 and the substrate 10 may be reduced. The cell transistor of a DRAM according to some embodiments of the present invention may be complete using processing steps described above with reference to FIGS. 5A to 5G According to some embodiments of the present invention, a pair of effective transistors is formed on an active pattern in the second doped region 70b. The second doped region 70b to which a bit line is connected is formed at the central portion of the active pattern 20a, and is electrically connected in common with the pair of the effective transistors. The first doped region 70a to which the capacitor is connected is formed at both lateral portions of the active pattern 20a. The second doped region 70b of the active pattern 20a is electrically connected to the substrate 10, thus a bias voltage may be applied through the body portion 21 of the substrate 10. Accordingly, the threshold voltage of the transistor may be varied using a back bias voltage. The channel region and the first doped region 70a of the active pattern 20a are electrically isolated from the body portion 21 of the substrate 10, so that the junction leakage current may be decreased and the short channel effect may also be reduced. Accordingly, a data retention time of the DRAM device may be increased.

Furthermore, the active pattern discussed above that is partially isolated from the body portion 21 of the substrate 10 is formed using conventional processes and, thus, no processing changes to maybe needed to form the devices according to some embodiments of the present invention. Accordingly, methods according to embodiments of the present invention may be more cost effective than conventional methods.

Figure 7:
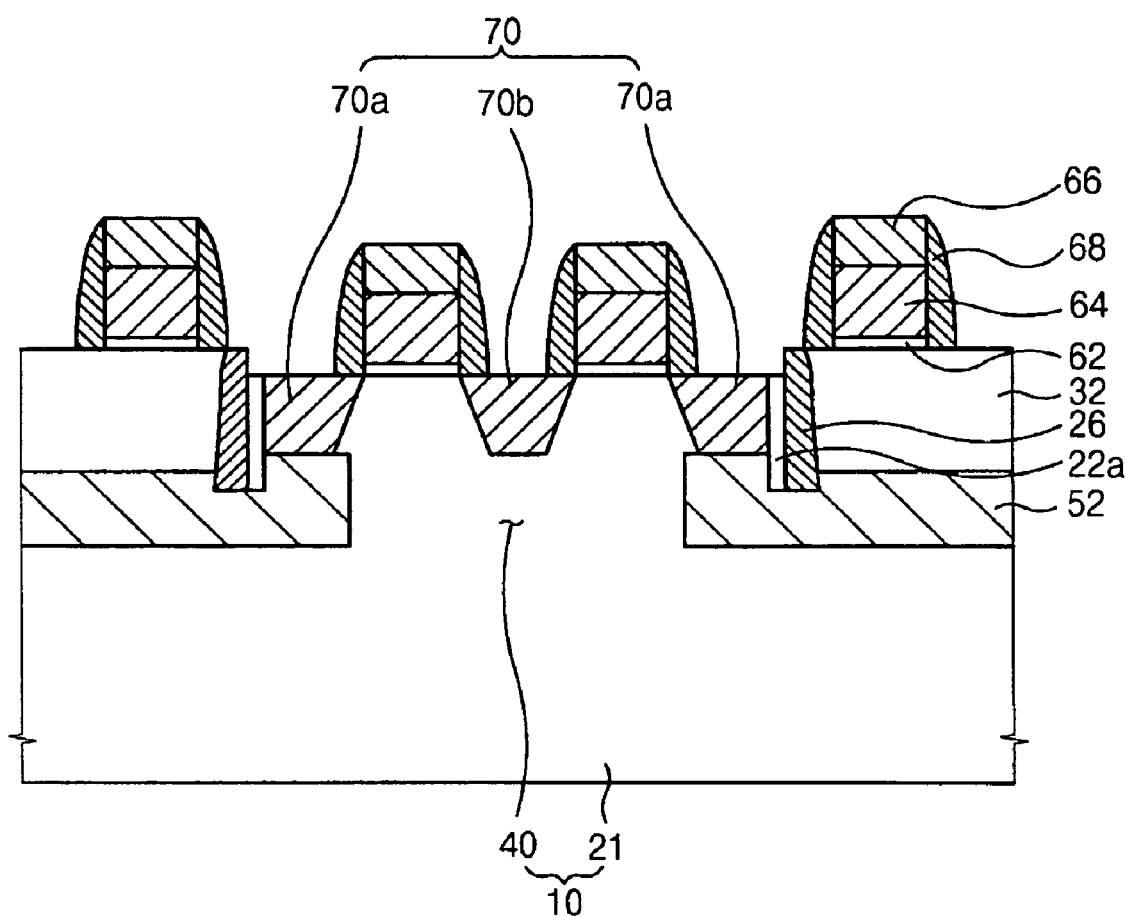
FIG. 7 is a cross section illustrating cell transistor of Dynamic Random Access Memories (DRAM) according to some embodiments of the present invention.

Referring now to FIG. 7, a cross section illustrating cell transistors of a DRAM according to some embodiments of the present invention will be discussed. The cell transistor illustrated in FIG. 7 is similar to the cell transistor discussed above with respect to FIGS. 5A through 5G, except that the buried insulating pattern only extends to a lower portion of the first doped region to which a capacitor is connected. Accordingly, processing steps for forming the cell transistor illustrated in FIG. 7 are very similar to the processing steps described with reference to FIGS. 5A to 5G. Therefore, like reference numerals denote the same elements as discussed above with respect to FIGS. 5A through 6 and, therefore, the details of these elements will not be discussed in detail herein.

The buried insulating pattern 52 is reduced in size relative to the buried insulating pattern 50 discussed with respect to FIGS. 5A through 6. Therefore, a depth of the trench 16 is reduced so that the first doped region to which a capacitor is connected may be formed directly over the buried insulating pattern 52. In some embodiments of the present invention, the trench 16 has a depth smaller than that of a conventional device isolation trench structure. In particular, the trench 16 has a depth corresponding to a thickness difference between the conventional device isolation trench structure and the buried insulating pattern.

When a lower edge portion of the preliminary active pattern is removed to provide an active pattern having a recessed portion at a lower portion thereof, the amount of etching performed is relatively less than that performed as discussed above with respect to FIGS. 5A through 6. A processing time of the thermal oxidation process for the buried insulating layer is also reduced relative to that of the cell transistor discussed with respect to FIGS. 5A through 6.

If the widths of each region in the active pattern are similar to each other, a problem may occur in that it may be difficult to electrically couple the second doped region to which a bit line is connected to the body portion of the substrate. The isotropic etching process on the substrate and the oxidation process form the buried insulating pattern toward the inside of the preliminary active pattern and, thus, the buried insulating pattern may be provided on the second doped region at a central portion of the active pattern. This may cause the second doped region to be isolated from the body portion of the substrate and, therefore, entirely isolate the active pattern from the body portion of the substrate.

To address this problem, in some embodiments of the present invention, the buried insulating pattern is only extended to a lower portion of the first doped region to which a capacitor is connected, thus the likelihood that the second doped region is covered with the buried insulating pattern may be reduced. Accordingly, even though widths of regions in the active pattern may be similar to each other, the first doped region may be sufficiently isolated from the substrate to thereby reduce the junction leakage current, and the second doped region may be sufficiently connected to the substrate to thereby ensure a stable operation of the transistor.

Figure 8A:
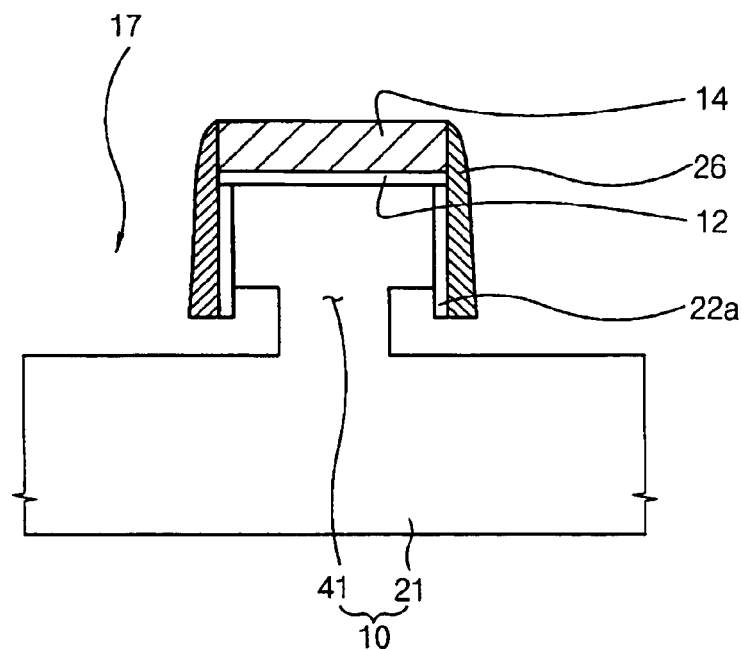
FIGS. 8A through 8D are cross sections illustrating processing steps in the fabrication of planar transistors according to some embodiments of the present invention.
Figure 8B:
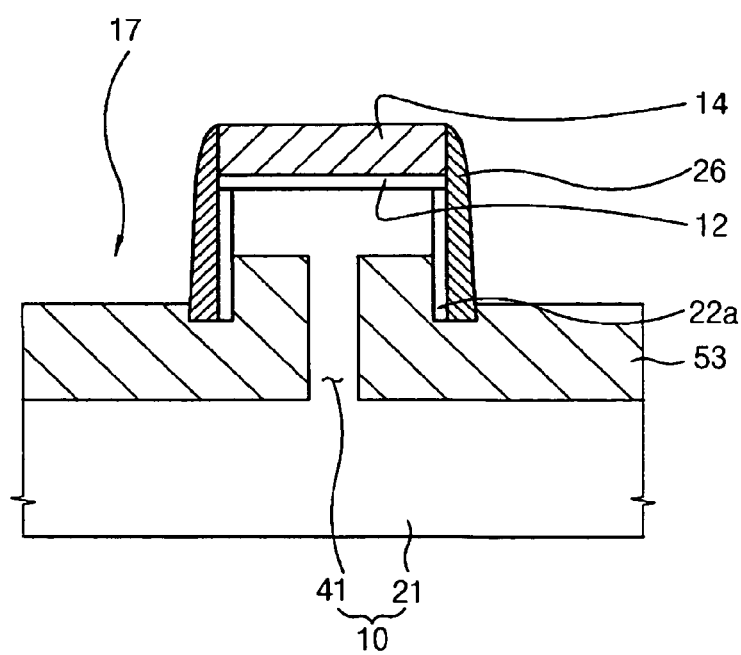
Figure 8C:
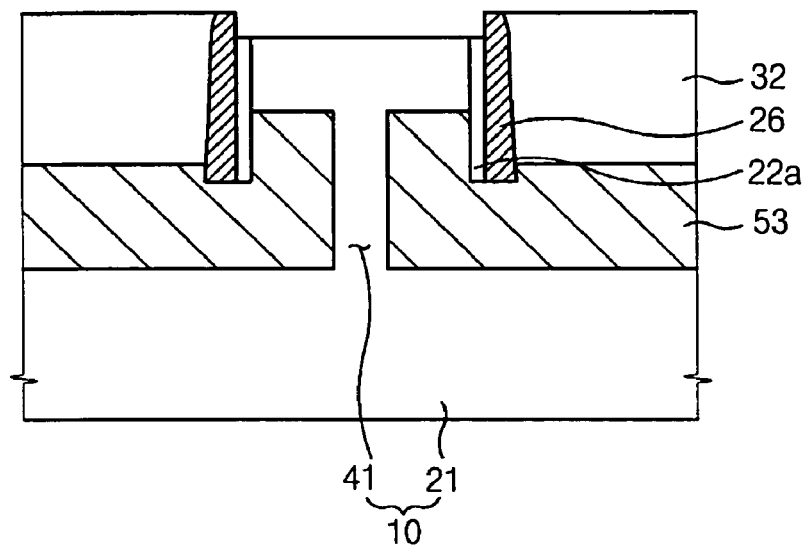
Figure 8D:
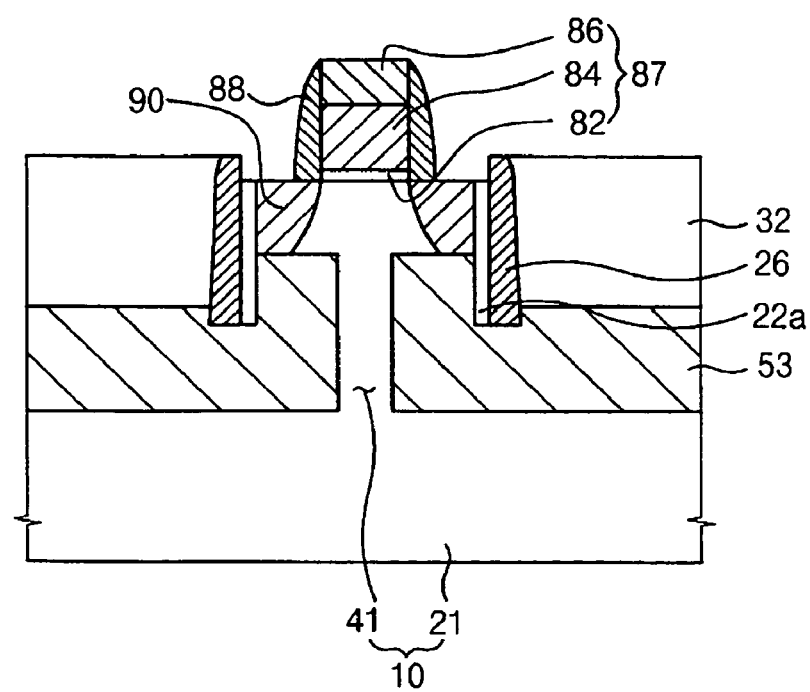
Figure 9:
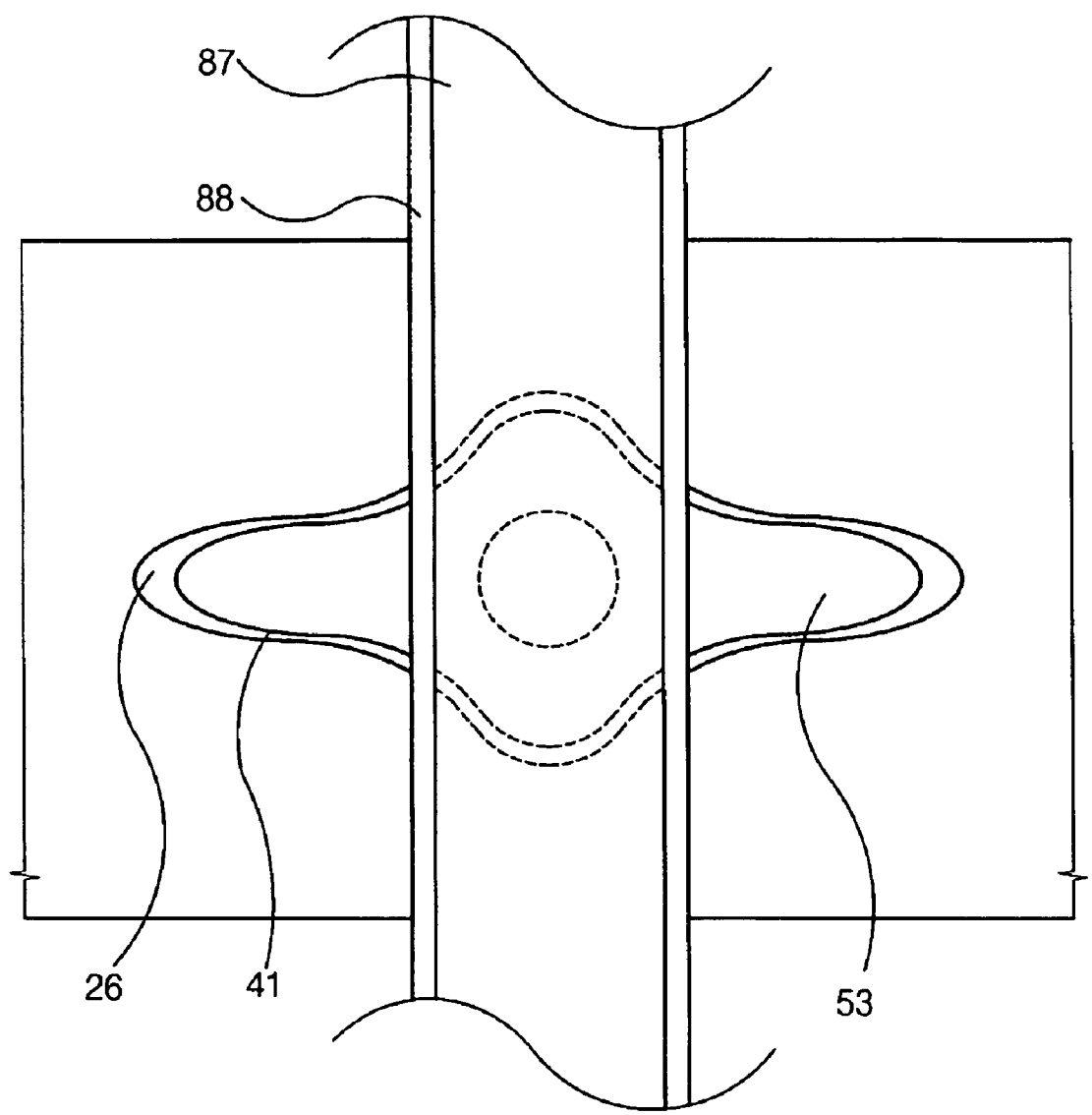
FIG. 9 is a plan view illustrating planar transistors according to some embodiment of the present invention.

Referring now to FIGS. 8A through 9. FIGS. 8A through 8D are cross sections illustrating processing steps in the fabrication of planar transistors according to some embodiments of the present invention. FIG. 9 is a plan view illustrating planar transistors according to some embodiments of the present invention. As illustrated in FIG. 8A, a preliminary active pattern is integrally formed on a semiconductor substrate 10 by forming a trench 17 using processing steps similar to those described above with reference to FIGS. 1A through 2F.

As described above with respect to FIGS. 1A through 2F, the preliminary active pattern has a plain top surface and a bulged shape swollen at a central portion in contrast to both end portions thereof. Therefore, the width of the preliminary active pattern is relatively greater at a bulged portion than at a non-bulged portion. The substrate 10 at a base portion of the preliminary active pattern is isotropically etched to form an active pattern 41 having a recessed portion at a lower portion thereof. In some embodiments of the present invention, for example, embodiments illustrated in FIGS. 8A through 9, a gate of the transistor is formed on the bulged portion having a relatively large width and the source and drain regions of the transistor is formed on the end portions having relatively small widths.

Referring now to FIG. 8B, the substrate 10 corresponding to a floor of the trench 17 and the lower portion of the active pattern 41 is thermally oxidized to form a buried insulating layer 53 on the bottom surface of the trench 17 and the lower portion of the active pattern 41.

The buried insulating pattern 53 extends at least partially under the source and drain regions of the active pattern 41. In particular, the buried insulating pattern 53 may extend to a portion beneath the source and drain regions of the active pattern 41 to thereby come into contact with the source and drain regions at a lower portion thereof.

A lower portion of a channel region of the active pattern 53 having a relatively large width is partially oxidized, and is electrically coupled to a body portion 21 of the substrate. A lower portion of the source and drain regions of the active pattern 53 having a relatively small width is completely oxidized, and is sufficiently isolated from the body portion 21 of the substrate.

Referring now to FIG. 8C, an oxide having excellent gap-fill characteristics is deposited on the substrate 10 in the trench 17 using, for example, a CVD process, so that a trench oxide layer 32 is formed on the substrate 10. The trench oxide layer 32 is removed and planarized using, for example, a CMP process or an etch-back process, until an upper surface of the nitride pattern 14 is exposed. Thus, that the trench oxide layer 32 remains in the trench 17. A first wet etching process is performed using a nitride-based etchant to thereby remove the nitride pattern 14. A second wet etching process is performed using an oxide-based etchant to thereby remove the buffer oxide pattern 12. Accordingly, the field region and the active region are separated from each other on the substrate 10.

Referring now to FIGS. 8D and 9, a damage prevention oxide layer (not shown) is formed on the substrate 10 including the active region and the field region so that the likelihood of the substrate being damaged during a subsequent implantation process may be reduced. Impurities are implanted in the substrate 10 for a threshold voltage control and a channel region of the transistor. The damage prevention oxide layer is removed after the dopants are implanted in the substrate 10.

A gate insulating layer is formed on the substrate 10 including the channel region. A gate electrode layer and a hard mask layer are sequentially formed on the gate insulating layer. The hard mask layer is partially removed using, for example, a photolithography process to thereby form a hard mask 86. The gate electrode layer and the gate insulating layer are sequentially etched using the hard mask 86 as an etching mask. Accordingly, a gate structure is completed and includes a gate insulation pattern 82, a gate electrode pattern 84 and the hard mask 86.

A silicon nitride layer is formed on the substrate 10 on which the gate structure is formed, and an anisotropic etching process is performed on the silicon nitride layer. A gate spacer 88 is formed on side surfaces of the gate structure. Dopants are implanted onto surface portions of the substrate using the gate structure as an implantation mask to thereby form source and drain regions 90 of the transistor. In some embodiments of the present invention, for example, embodiments illustrated in FIGS. 8A through 8D, the source and drain regions 90 of the transistor extend to an upper surface of the buried oxide pattern 53, so that the junction capacitance between the source and drain regions 90 and the substrate 10 may be minimized.

Figure 10A:
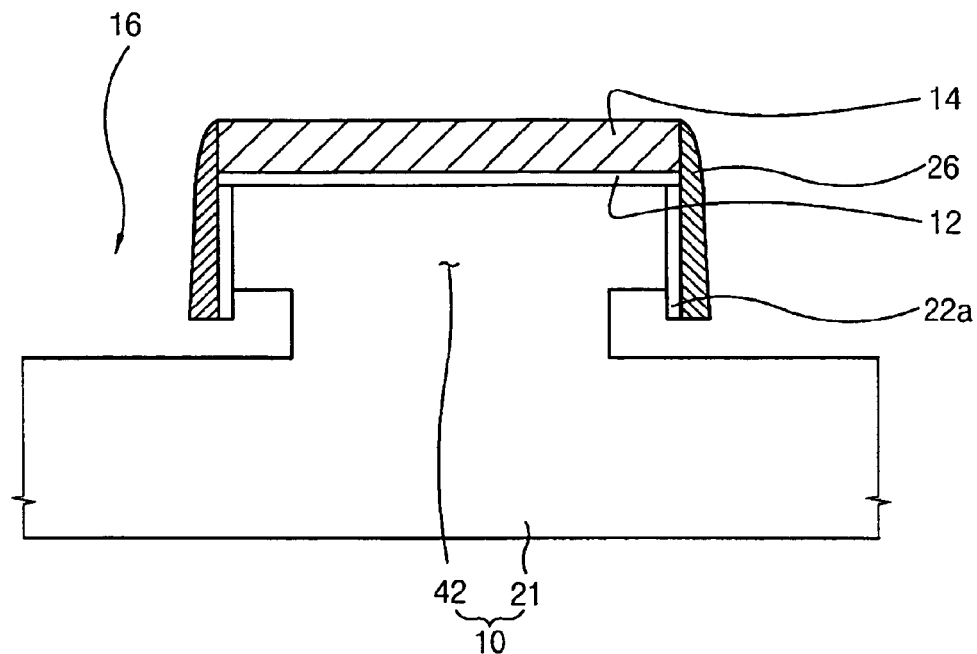
FIGS. 10A through 10F are cross sections illustrating processing steps in the fabrication of cell transistors according to some embodiments of the present invention.

Referring now to FIGS. 10A through 10F, cross sections illustrating processing steps in the fabrication of transistors according to some embodiments of the present invention will be discussed. As illustrated in FIG. 10A, a preliminary active pattern 42 is integrally formed on a semiconductor substrate 10 by forming a trench 16 using processing steps similar to those discussed above with respect to FIGS. 1A to 2F. Typically, a bit line and a capacitor are interconnected in the cell transistor of a DRAM, and need not overlap with each other. The cell transistor of the DRAM is formed on an active pattern that is to be formed from the preliminary active pattern. A capacitor of the DRAM is formed on a doped region at end portions of the active pattern, and a bit line of the DRAM is formed on a doped region at a central portion of the active pattern.

The preliminary active pattern 42 has at least two widths for respectively connecting the capacitor and the bit line to the doped regions of the active pattern without overlapping with each other. In some embodiments of the present invention, for example, embodiments illustrated in FIGS. 10A through 10F, the preliminary active pattern 42 has a plain top surface and a bulged shape swollen at a central portion in contrast to both end portions, as described above with respect to FIG. 3. Therefore, a first region neighboring end portions of the preliminary active pattern has a greater width than a second region neighboring central portion of the preliminary active pattern. In other words, the width of the preliminary active pattern 42 is greater at the second region corresponding to a bulged portion than at the first region corresponding to a non-bulged portion.

The substrate 10 at a base portion of the preliminary active pattern 42 is partially removed to provide an active pattern 42 having a recessed portion at a base portion thereof. When dopants are implanted in surface portions of the substrate, the first and second regions of the active pattern 42 are referred to as first and second doped regions of the active pattern, respectively.

Figure 10B:
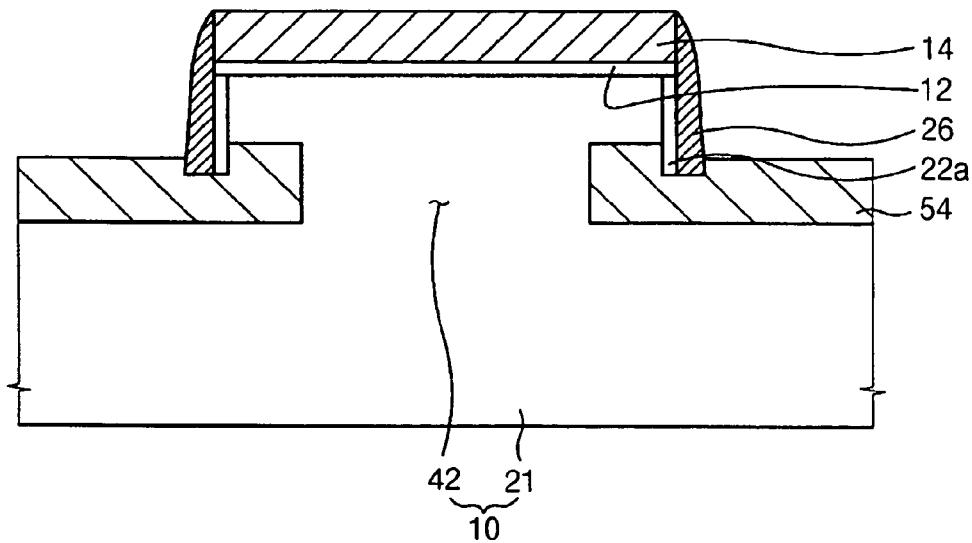

Referring now to FIG. 10B, the silicon substrate 10 on a floor of the trench 16 and the recessed portion at the base portion of the active pattern are thermally oxidized to provide a buried insulating pattern 54 on the floor of the trench 16 and in the recessed portion at the base portion of the active pattern. The buried insulating pattern 54 is formed under the first doped region of the active pattern to which the capacitor is electrically connected, and is not formed under a channel region of the active pattern. The channel region is formed between the first and second doped regions.

The second doped region to which the bit line is electrically connected has a relatively large width, and the first doped region has a relatively small width. The silicon substrate under the first doped region of the active pattern is completely oxidized, thus the buried insulating pattern 54 is formed between the active pattern and the substrate 10. Therefore, the active pattern is sufficiently isolated from the body portion 21 of the substrate 10. The silicon substrate under the second doped region of the active pattern is partially oxidized, thus the buried oxide pattern is not completely formed between the active pattern and the substrate 10. Therefore, the active pattern is partially connected to the body portion 21 of the substrate 10. In some embodiments of the present invention, for example, embodiments of the present invention illustrated in FIGS. 10A through 10F, the silicon substrate under the channel region of the active pattern is also partially oxidized, so that the channel region of the active pattern is connected to the body portion 21 of the substrate 10.

Figure 10C:
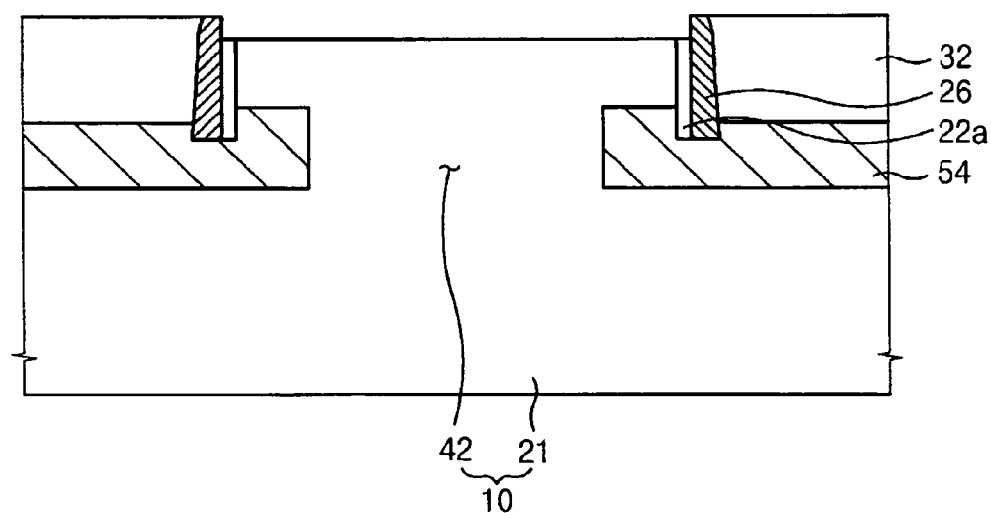

Referring now to FIG. 10C, an oxide having excellent gap-filling characteristics is deposited on the substrate 10 in the trench 16 using, for example, a CVD process, so that a trench oxide layer 32 is formed on the substrate 10. The trench oxide layer 32 is removed and planarized using, for example, a CMP process or an etch-back process, until a top surface of the nitride pattern 14 is exposed. Thus, the trench oxide layer 32 remains in the trench 16. A first wet etching process is performed using a nitride-based etchant to thereby remove the nitride pattern 14. A second wet etching process is performed using an oxide-based etchant to thereby remove the buffer oxide pattern 12. Accordingly, the field region and the active region are separated from each other on the substrate 10.

Figure 10D:
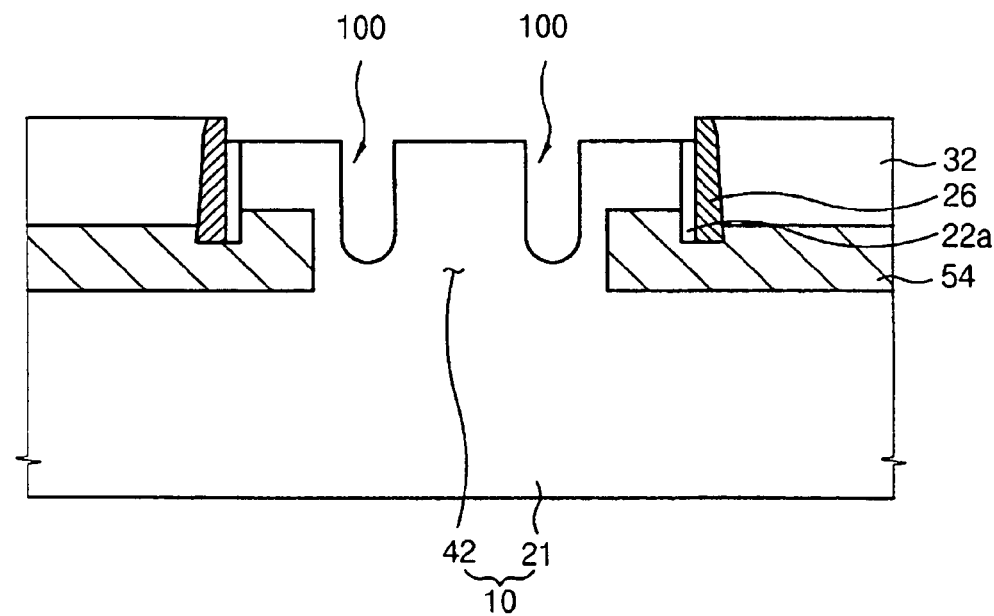

Referring now to FIG. 10D, a damage prevention oxide layer (not shown) is formed on the substrate 10 including the active region and the field region to reduce the likelihood of substrate damage during a subsequent implantation process. Impurities, such as dopants, are implanted in the substrate for a threshold voltage control and a channel of the transistor. When the cell transistor of the DRAM is, for example, an NMOS transistor, P type dopants are implanted in the substrate 10. The damage prevention oxide layer is removed after the dopants are implanted onto the substrate. A gate region of the active pattern on which a gate structure is to be formed is selectively removed to provide at least one gate recess portion 100 on the gate region of the active pattern.

Figure 10E:
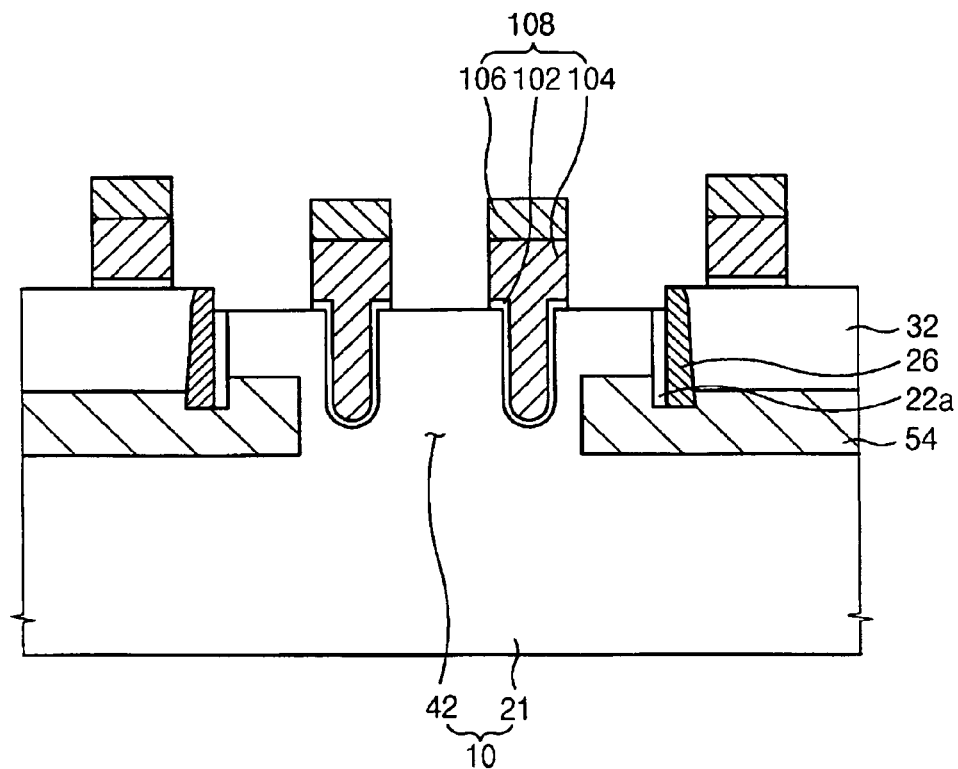

Referring now to FIG. 10E, a gate insulating layer (not shown) is formed on a surface of the substrate 10 and on an inner surface of the gate recess portion 100. A gate electrode layer (not shown) is formed on the gate insulating layer in the gate recess portion 100. A hard mask layer (not shown) is formed on the gate electrode layer. The hard mask layer is partially removed using, for example, a conventional photolithography process, to provide a hard mask 106. The gate electrode layer and the gate insulating layer are sequentially removed using the hard mask 106 as an etching mask to complete a gate structure 108. The gate structure includes a gate insulation pattern 102, a gate electrode pattern 104 and the hard mask 106.

Figure 10F:
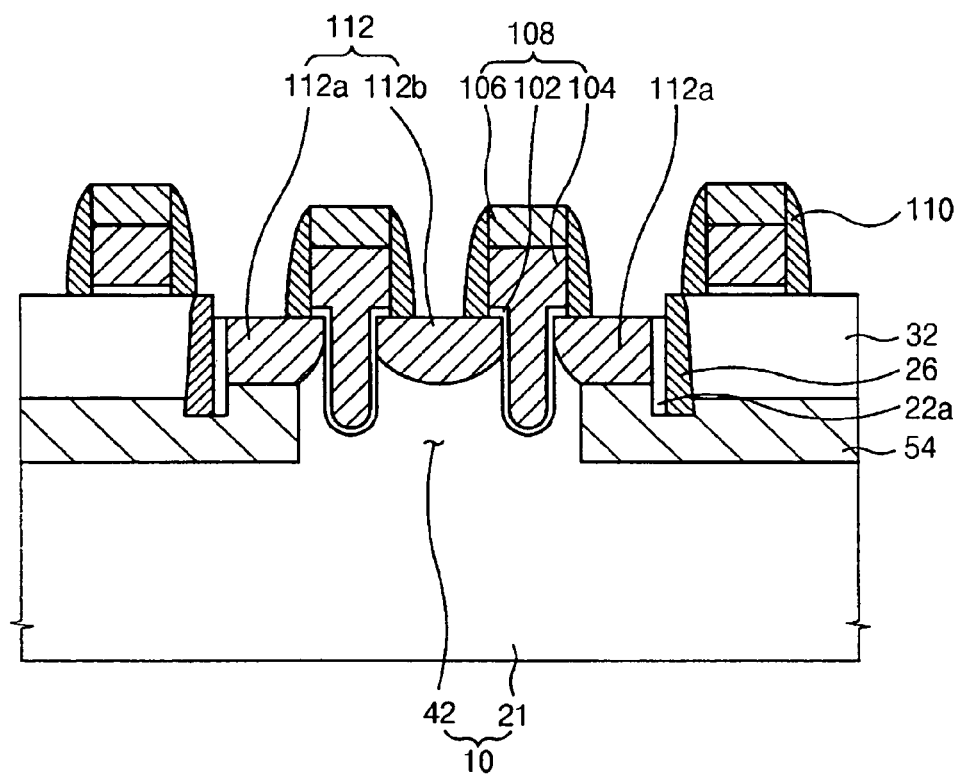

Referring now to FIG. 10F, a silicon nitride layer (not shown) is formed on the substrate 10 on which the gate structure 108 is formed, and an anisotropic etching process is performed on the silicon nitride layer. A gate spacer 110 is formed on side surfaces of the gate structure 108. Dopants are implanted in surface portions of the substrate using the gate structure 108 as an implantation mask to thereby form source and drain regions 112 of the transistor on the active pattern. The source and drain regions 112 of the transistor include a first doped region 112a to which a capacitor is connected and a second doped region 112b to which a bit line is connected. In some embodiments of the present invention, for example, embodiments illustrated in FIGS. 10A through 10F, the first doped region 112a makes contact with an upper surface of the buried insulating pattern 54, so that the junction capacitance between the source and drain regions and the substrate 10 may be reduced. The cell transistor of the DRAM illustrated in FIG. 10F includes a recessed channel, and thus the channel length may be elongated to thereby minimize the short channel effect in the DRAM.

Figure 11A:
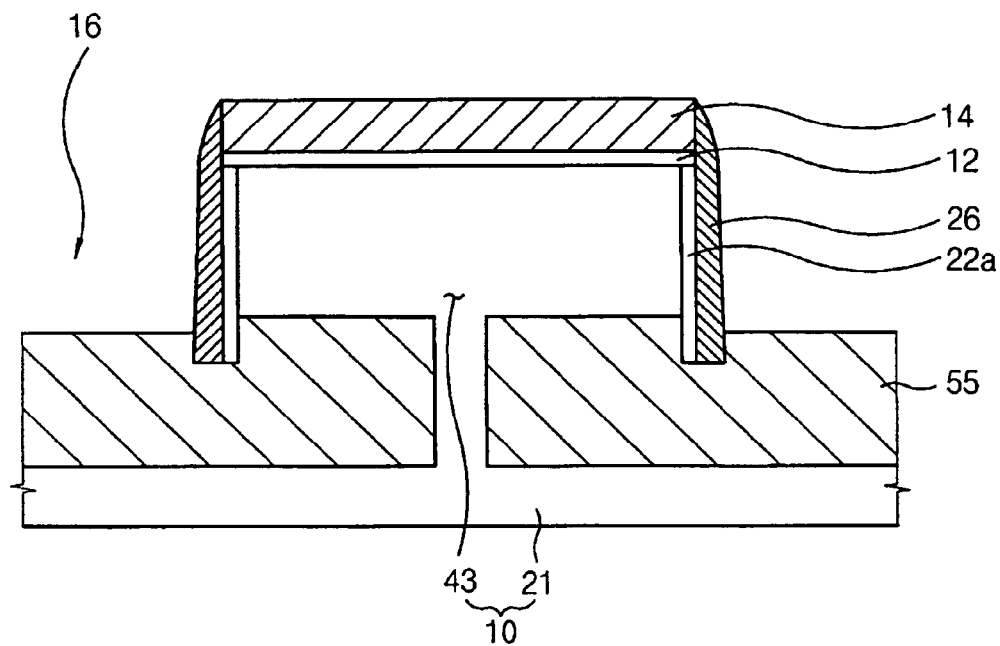
FIGS. 11A through 11D are cross sections illustrating processing steps in the fabrication of cell transistors according to some embodiments of the present invention.

Referring now to FIGS. 11A through 11D, cross sections illustrating processing steps in the fabrication of cell transistors according some embodiments of the present invention will be discussed. As illustrated in FIG. 11A, a preliminary active pattern is integrally formed on a semiconductor substrate 10 by forming a trench 16 using processing steps similar to those discussed above with respect to FIGS. 1A to 2F. In some embodiments of the present invention, the trench 16 is deeper than a depth of a gate recess portion that is to be formed in a subsequent process.

Generally, a bit line and a capacitor are interconnected with each other in the cell transistor of the DRAM, and need not overlap with each other. The cell transistor of the DRAM is formed on an active pattern that is to be formed from the preliminary active pattern. A capacitor of the DRAM is formed on a doped region at end portions of the active pattern, and a bit line of the DRAM is formed on a doped region at a central portion of the active pattern.

Accordingly, the preliminary active pattern requires at least two widths for respectively connecting the capacitor and the bit line to the doped regions of the active pattern without overlapping with each other. In some embodiments of the present invention, the preliminary active pattern has a plain top surface and a bulged shape swollen at a central portion in contrast to both end portions, as described above with respect to FIG. 3. A first region neighboring end portions of the preliminary active pattern has a greater width than a second region neighboring central portion of the preliminary active pattern. In other words, the width of the preliminary active pattern is greater at the second region corresponding to a bulged portion than at the first region corresponding to a non-bulged portion.

The substrate 10 at a base portion of the preliminary active pattern is partially removed to provide an active pattern 43 having a recessed portion at a base portion thereof. When dopants are implanted in surface portions of the substrate 10 in a subsequent process, the first and second regions of the preliminary active pattern are referred to as first and second doped regions of the active pattern, respectively.

The silicon substrate 10 on the floor of the trench 16 and the recessed portion at the base portion of the active pattern 43 are thermally oxidized to provide a buried insulating pattern 55 on the bottom surface of the trench 16 and in the recessed portion at the base portion of the active pattern 43. The buried insulating pattern 55 is formed under the first doped region of the active pattern to which the capacitor is electrically connected, and is also formed under a channel region of the active pattern. The channel region is formed between the first and second doped regions. That is, the buried insulating pattern 55 extends into the active pattern 43 further than the buried insulating pattern discussed above with respect to FIGS. 10A through 10F.

Figure 11B:
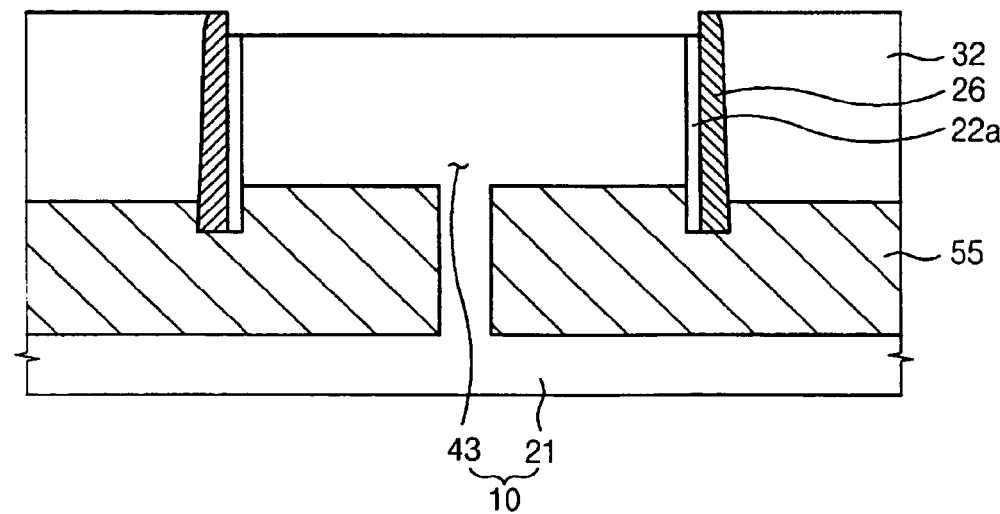

Referring now to FIG. 11B, an oxide having excellent gap-filling characteristics is deposited on the substrate 10 the trench 16 using, for example, a CVD method, so that a trench oxide layer 32 is formed on the substrate 10. The trench oxide layer 32 is removed and planarized using, for example, a CMP process or an etch-back process, until a top surface of the nitride pattern 14 is exposed. Thus, the trench oxide layer 32 remains in the trench 16. A first wet etching process is performed using a nitride-based etchant to thereby remove the nitride pattern 14. A second wet etching process is performed using an oxide-based etchant to thereby remove the buffer oxide pattern 12. Accordingly, the field region and the active region are separated from each other on the substrate 10.

Figure 11C:
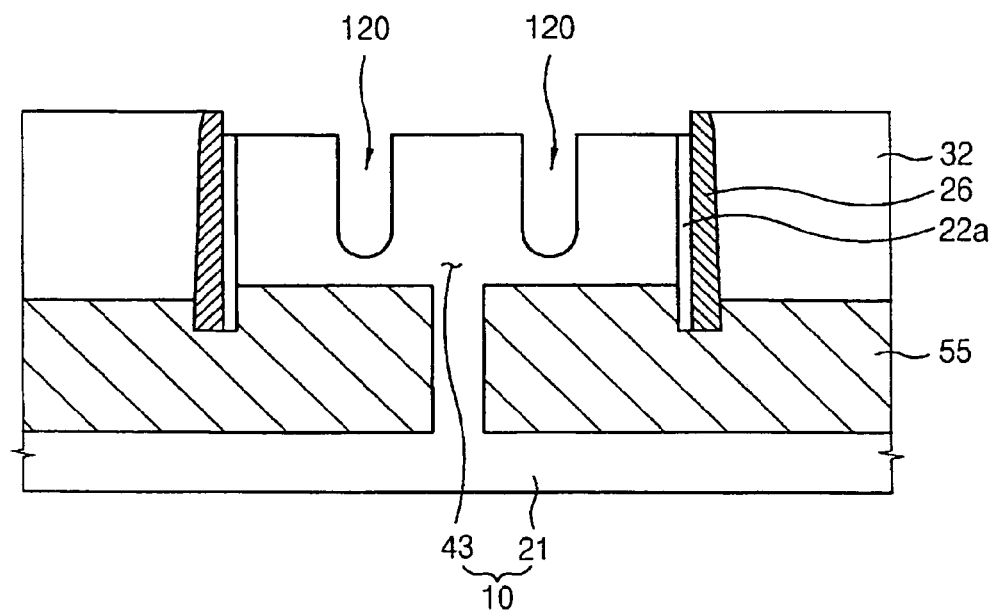

Referring now to FIG. 11C, a damage prevention oxide layer (not shown) is formed on the substrate 10 including the active region and the field region to reduce the likelihood of substrate damage during a subsequent implantation process. Impurities such as dopants are implanted in the substrate 10 for threshold voltage control and a channel of the transistor. When the cell transistor of the DRAM is, for example, an NMOS transistor, P type dopants are implanted in the substrate 10. The damage prevention oxide layer is removed after the dopants are implanted onto the substrate 10.

A gate region of the active pattern on which a gate structure is to be formed in a subsequent process is selectively etched away to provide at least one gate recess portion 120 on the gate region of the active pattern 43. In some embodiments of the present invention, the gate recess portion 120 has a depth such that an upper surface of the buried insulating pattern 55 is not exposed. Thus, the gate recess portion 120 does not make contact with the buried oxide pattern 55.

Figure 11D:
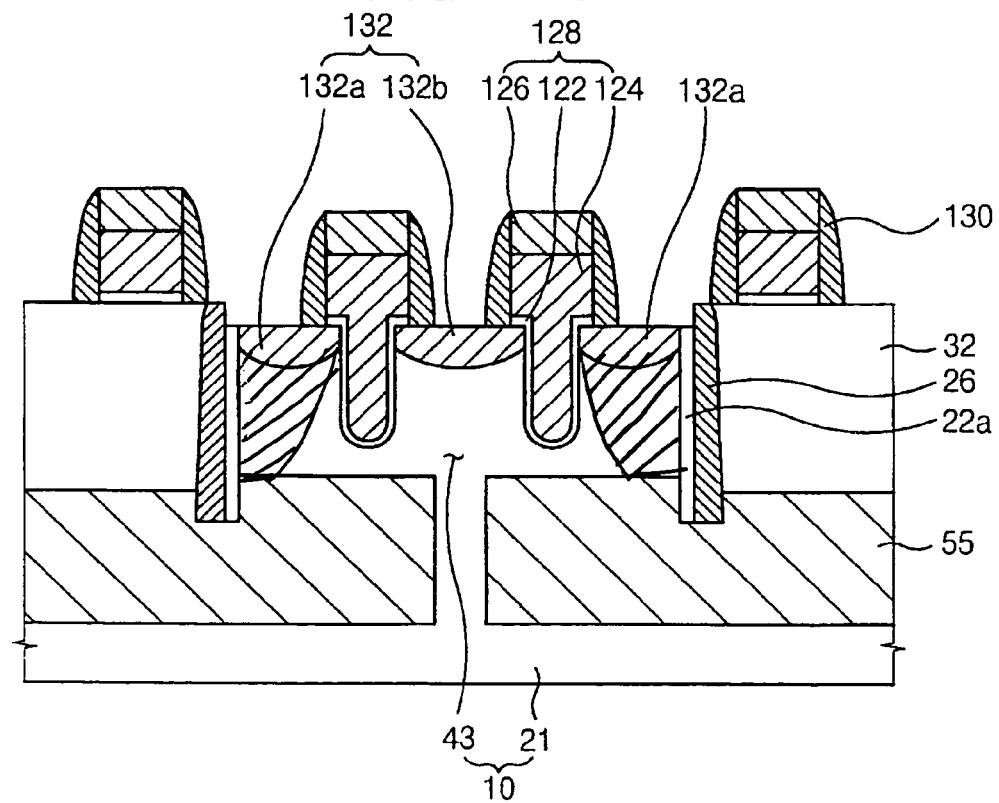

Referring now to FIG. 11D, a gate insulating layer (not shown) is formed on a surface of the substrate 10 and an inner surface of the gate recess portion 120. A gate electrode layer (not shown) is formed on the gate insulating layer in the gate recess portion 120. A hard mask layer (not shown) is formed on the gate electrode layer. The hard mask layer is partially removed using, for example, a conventional photolithography process, to thereby form a hard mask 126. The gate electrode layer and the gate insulating layer are sequentially etched using the hard mask 126 as an etching mask to provide the gate structure 128. The gate structure 128 includes a gate insulation pattern 122, a gate electrode pattern 124 and the hard mask 126.

A silicon nitride layer (not shown) is formed on the substrate 10 on which the gate structure 128 is formed, and an anisotropic etching process is performed on the silicon nitride layer. A gate spacer 130 is formed on side surfaces of the gate structure 128. Dopants are implanted onto surface portions of the substrate using the gate structure 128 as an implantation mask to thereby form source and drain regions 132 of the transistor on the active pattern 55. The source and drain regions 132 of the transistor includes a first doped region 132a to which a capacitor is connected and a second doped region 132b to which a bit line is connected. The first doped region 132a makes contact with a top surface of the buried oxide pattern 55, so that the junction capacitance between the source and drain regions and the substrate 10 may be reduced.

Figure 12A:
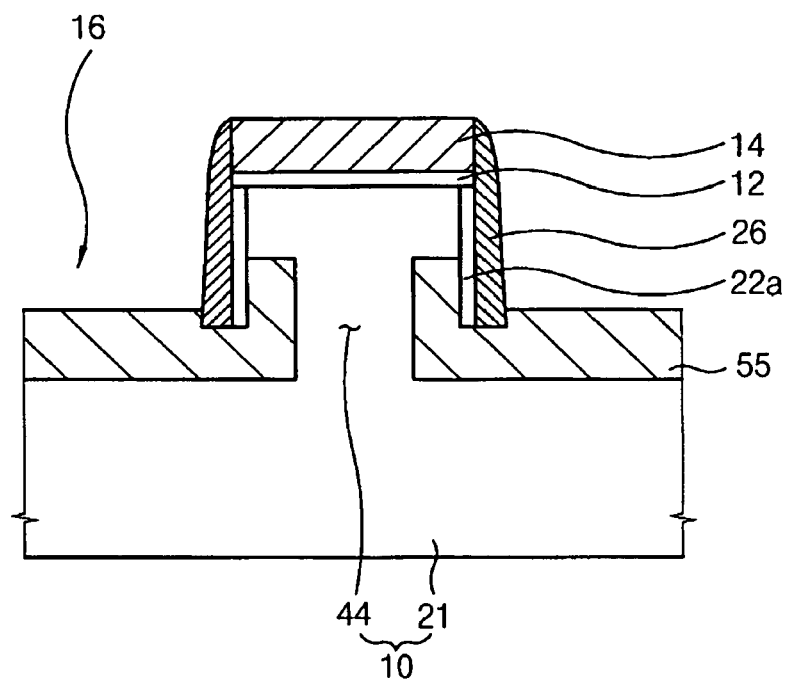
FIGS. 12A through 12D are cross sections illustrating processing steps in the fabrication of cell transistors according to some embodiments f the present invention.

Referring now to FIGS. 12A to 12D, cross sections illustrating processing steps in the fabrication of transistors according to some embodiments of the present invention will be discussed. As illustrated in FIG. 12A, a preliminary active pattern is integrally formed on a semiconductor substrate 10 by forming a trench 16 using processing steps similar to those discussed above with respect to FIGS. 1A to 2F.

The preliminary active pattern includes at least two widths for respectively connecting the capacitor and the bit line to the doped regions of the preliminary active pattern without overlapping with each other. In the present embodiment, the preliminary active pattern has a plain top surface and a bulged shape swollen at a central portion in contrast to both end portions, as described above with respect to FIG. 3. Therefore, a first region neighboring end portions of the preliminary active pattern has a greater width than a second region neighboring central portion of the preliminary active pattern. In other words, the width of the preliminary active pattern is greater at the second region corresponding to a bulged portion than at the first region corresponding to a non-bulged portion.

The substrate at a base portion of the preliminary active pattern is partially removed to provide an active pattern 44 having a recessed portion at a base portion thereof. When dopants are implanted in surface portions of the substrate 10, the first and second regions of the preliminary active pattern are referred to as first and second doped regions of the active pattern, respectively.

A gate of the transistor is formed on the bulged portion of the active pattern having a relatively large width, and source and drain regions are formed on the non-bulged portion of the active pattern having a relatively small width. The silicon substrate 10 on the floor of the trench 16 and the recessed portion at the base portion of the active pattern 44 are thermally oxidized, and thus a buried insulating pattern 55 is formed on the floor of the trench 16 and in the recessed portion at the base portion of the active pattern. The buried insulating pattern 55 is formed under the source and drain regions of the active pattern.

The second doped region on which a channel is formed has a relatively large width, and the first doped region on which the source and regions drain are formed has a relatively small width. The silicon substrate 10 under the first doped region of the active pattern is completely oxidized, thus the buried insulating pattern 55 is formed between the active pattern and the substrate 10. Therefore, the active pattern is sufficiently isolated from the body portion 21 of the substrate 10. The silicon substrate 10 under the second doped region of the active pattern is partially oxidized, thus the buried insulating pattern 55 is not completely formed between the active pattern and the substrate 10. Therefore, the active pattern is partially connected to the body portion 21 of the substrate 10.

Figure 12B:
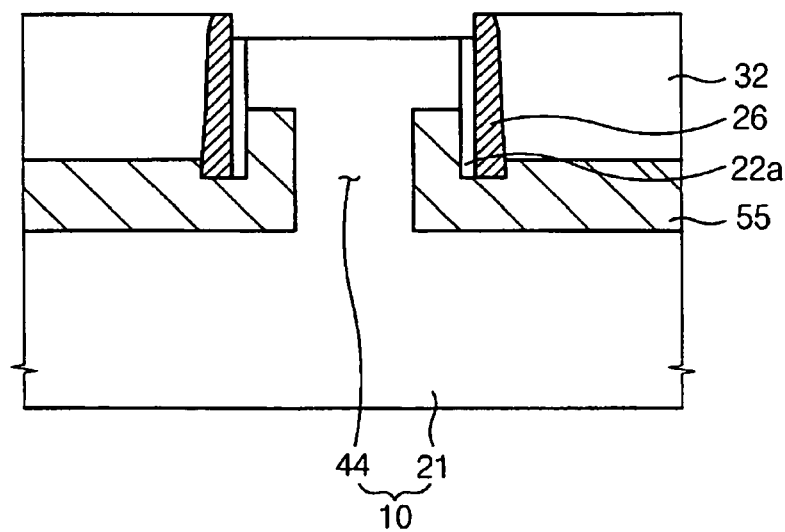

Referring now to FIG. 12B, an oxide having excellent gap-filling characteristic is deposited on the substrate 10 in the trench 16 using, for example, a CVD method, so that a trench oxide layer 32 is formed on the substrate 10. The trench oxide layer 32 is removed and planarized using, for example, a CMP process or an etch-back process, until a top surface of the nitride pattern 14 is exposed. The trench oxide layer 32 remains in the trench 16. A first wet etching process is performed using a nitride-based etchant to thereby remove the nitride pattern 14. A second wet etching process is performed using an oxide-based etchant to thereby remove the buffer oxide pattern 12. Accordingly, the field region and the active region are separated from each other on the substrate 10.

Figure 12C:
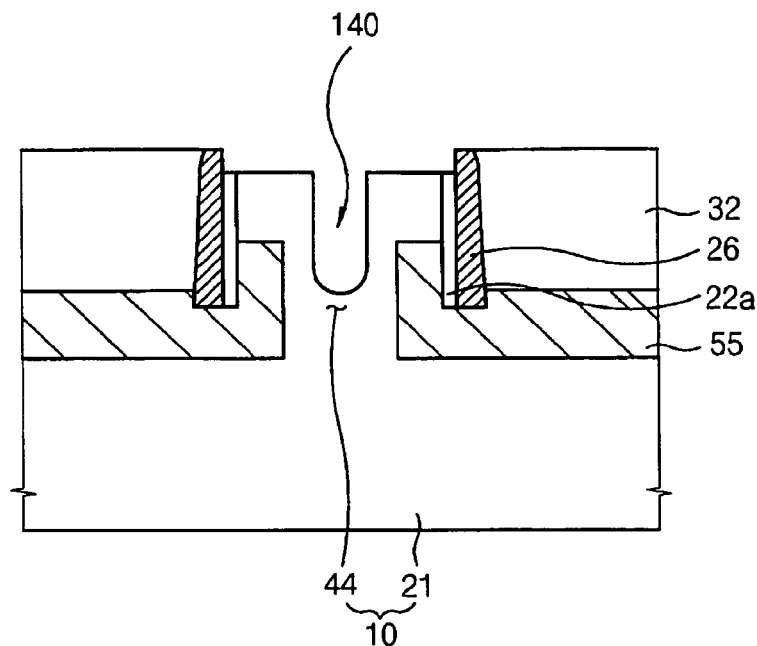

Referring now to FIG. 12C, a damage prevention oxide layer (not shown) is formed on the substrate 10 including the active region and the field region to reduce the likelihood of damage to the substrate during a subsequent implantation process. Impurities such as dopants are implanted onto the substrate 10 for threshold voltage control and a channel of the transistor. The damage prevention oxide layer is removed after the dopants are implanted onto the substrate.

A gate region of the active pattern on which a gate structure is to be formed is selectively etched to provide at least one gate recess portion 140 on the gate region of the active pattern. The gate recess portion 140 has a depth such that an upper surface of the buried insulating pattern 55 is not exposed.

Figure 12D:
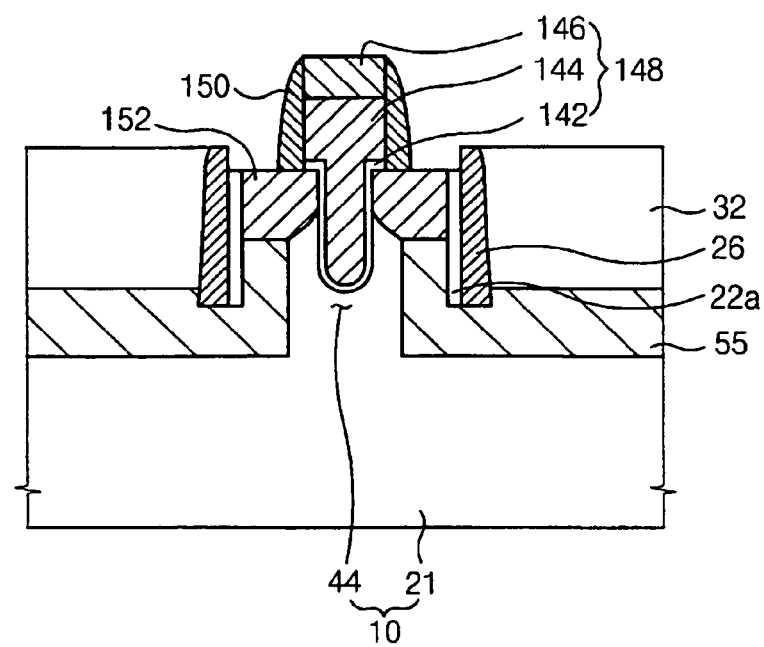

Referring now to FIG. 12D, a gate insulating layer (not shown) is formed on a surface of the substrate 10 and an inner surface of the gate recess portion 140. A gate electrode layer (not shown) is formed on the gate insulating in the gate recess portion 140. A hard mask layer (not shown) is formed on the gate electrode layer. The hard mask layer is partially removed using, for example, a photolithography process to thereby form a hard mask 146. The gate electrode layer and the gate insulating layer are sequentially etched away using the hard mask 146 as an etching mask to provide the gate structure 148. Accordingly, the gate structure 148 includes a gate insulation pattern 142, a gate electrode pattern 144 and the hard mask 146.

A silicon nitride layer (not shown) is formed on the substrate 10 on which the gate structure 148 is formed, and an anisotropic etching process is performed on the silicon nitride layer. A gate spacer 150 is formed on side surfaces of the gate structure 148. Dopants are implanted in surface portions of the substrate using the gate structure 148 as an implantation mask to thereby form source and drain regions 152 of the transistor on the active pattern. The source and drain regions 152 of the transistor include a first doped region to which a capacitor is connected and a second doped region to which a bit line is connected. The first doped region makes contact with a top surface of the buried insulating pattern 55, so that the junction capacitance between the source and drain regions and the substrate 10 may be reduced.

Figure 13A:
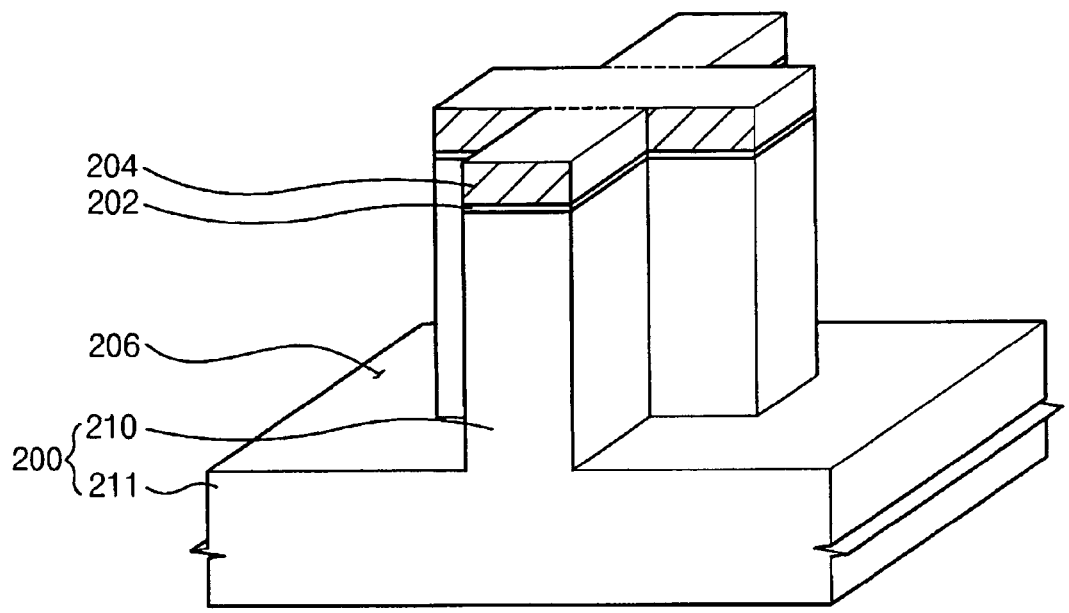
FIGS. 13A through 13D are perspective views illustrating processing steps in the fabrication of fin type Metal Oxide Semiconductor (MOS) transistors according to some embodiments of the present invention.

Referring now to FIGS. 13A to 13G, perspective views illustrating processing steps in the fabrication of a fin type MOS transistors according some embodiments of the present invention will be discussed. As illustrated in FIG. 13A, a buffer insulating layer (not shown), for example, a buffer oxide layer, is formed on a bulk semiconductor substrate 200, and a silicon nitride layer (not shown) is formed on the buffer insulating layer. The buffer insulating layer may reduce an amount of stress generated during forming the silicon nitride layer.

The nitride layer is partially dry-etched using, for example, a conventional photolithography process to thereby form a nitride pattern 204, and the buffer insulating layer is also dry-etched using the nitride pattern 204 as an etching mask to thereby form a buffer oxide pattern 202 through which a surface of the substrate 200 is partially exposed. The exposed substrate 200 is etched to a predetermined depth using the nitride pattern as an etching mask to thereby form a trench 206. Accordingly, the substrate 200 is divided into a protruded portion 210 and a body portion 211 by the trench 206. Hereinafter, the protruded portion 210 of the substrate 200 is referred to as a preliminary active fin. The trench 206 has a depth greater than a height of the preliminary active fin 210. An anti-reflection layer (ARL) may be further formed on the nitride layer to possibly increase a processing margin of the photolithography process for the trench 206. In some embodiments of the present invention, the preliminary active pattern 210 has also at least two widths as described above in the various exemplary embodiments of the present invention.

Figure 13B:
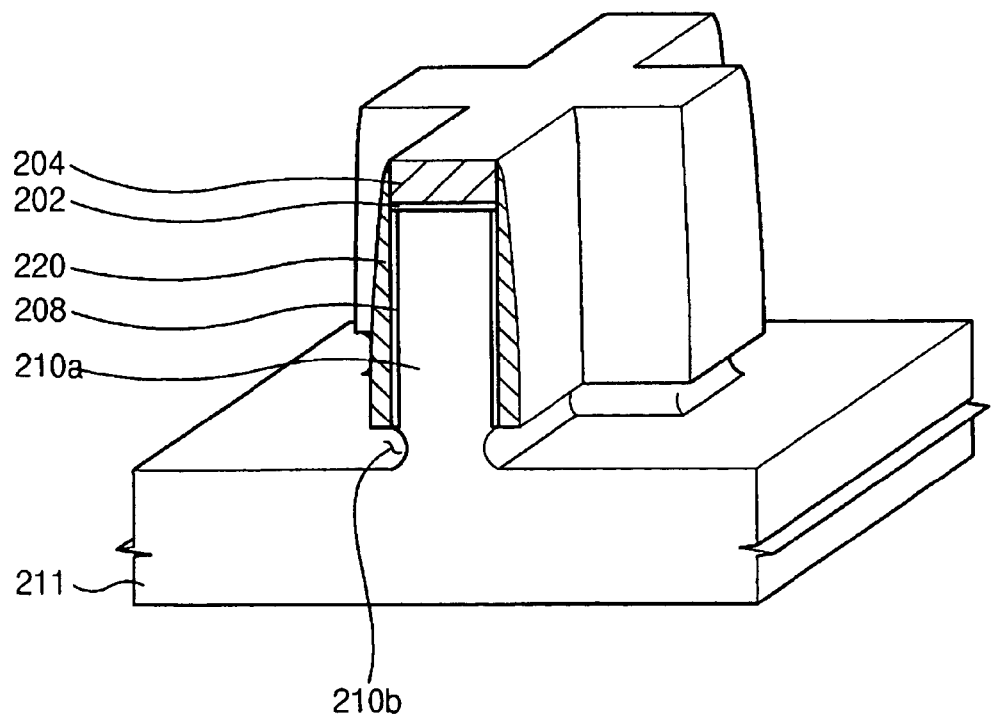

Referring now to FIG. 13B, processing steps similar to those described above with respect to FIGS. 1B through 2F are performed on the substrate 200 including the preliminary active fin 210. An inner oxide layer 208 is formed on a bottom surface and side surfaces of the trench 206, and a nitride spacer 220 is formed along the side surface of the trench 206. The inner oxide layer 208 is removed from the bottom surface of the trench 206, and the preliminary active fin 210 is partially removed at a base portion thereof. Accordingly, the preliminary active pattern 210 is formed into an active fin 210a having a recessed portion 210b. In addition, the active pattern 210a has a first region having a relatively small width and a second region having a relatively large width.

Figure 13C:
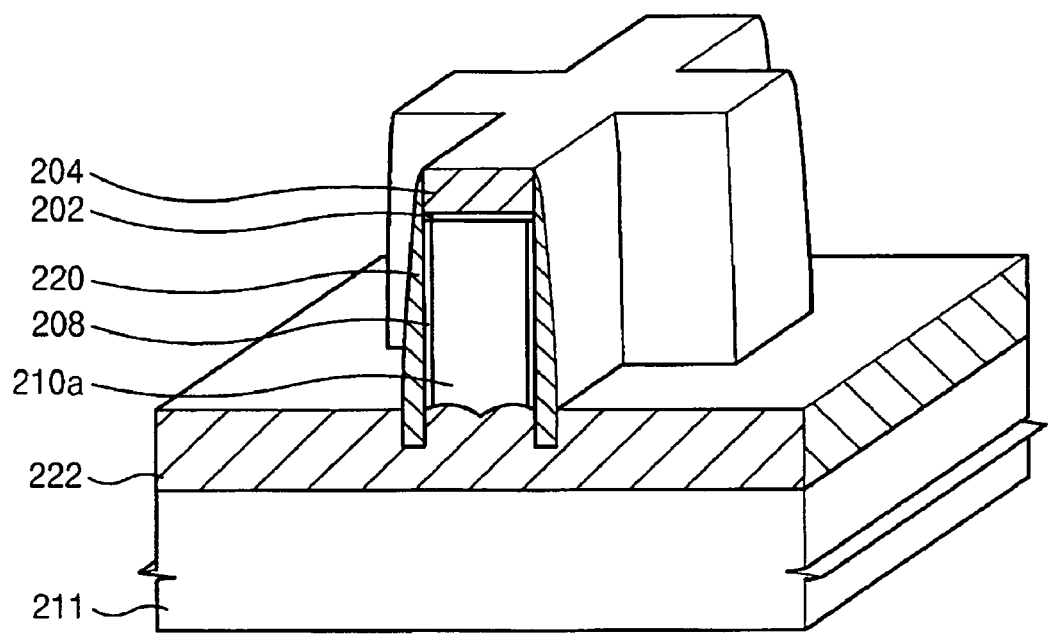

Referring now to FIG. 13C, the body portion 211 of the silicon substrate 200 of a floor of the trench 206 and the recessed portion 210b are thermally oxidized, and thus a buried insulating pattern 222 is formed on the bottom surface of the trench 206 and in the recessed portion 210b at the base portion of the active fin 210a. The silicon substrate 200 under the first region of the active pattern 210a is completely oxidized, and the buried insulating pattern 222 is wholly formed between the active pattern 210a and the body portion 211 of the substrate 200. Accordingly, the active fin 210a is sufficiently isolated from the body portion 211 of the substrate 200 at a lower portion of the first region. The silicon substrate 200 under the second region of the active fin 210a is partially oxidized, and the buried oxide pattern 222 is partially formed between the active fin 210a and the body portion 211 of the substrate 200. Accordingly, the active fin 210a is connected to the body portion 211 of the substrate 200 in a body at a lower portion of the second region.

Figure 13D:
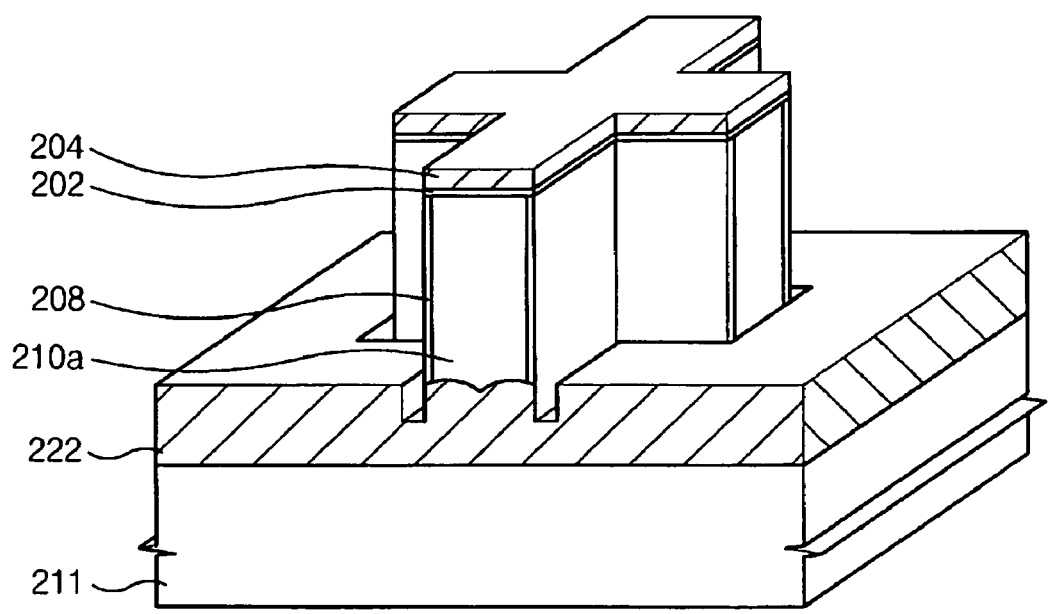

As illustrated in FIG. 13D, the nitride spacer 220 is removed from the side surface of the active fin 210a using, for example, an anisotropic etching process. The hard mask is also partially etched out when the nitride spacer 220 is removed.

Figure 13E:
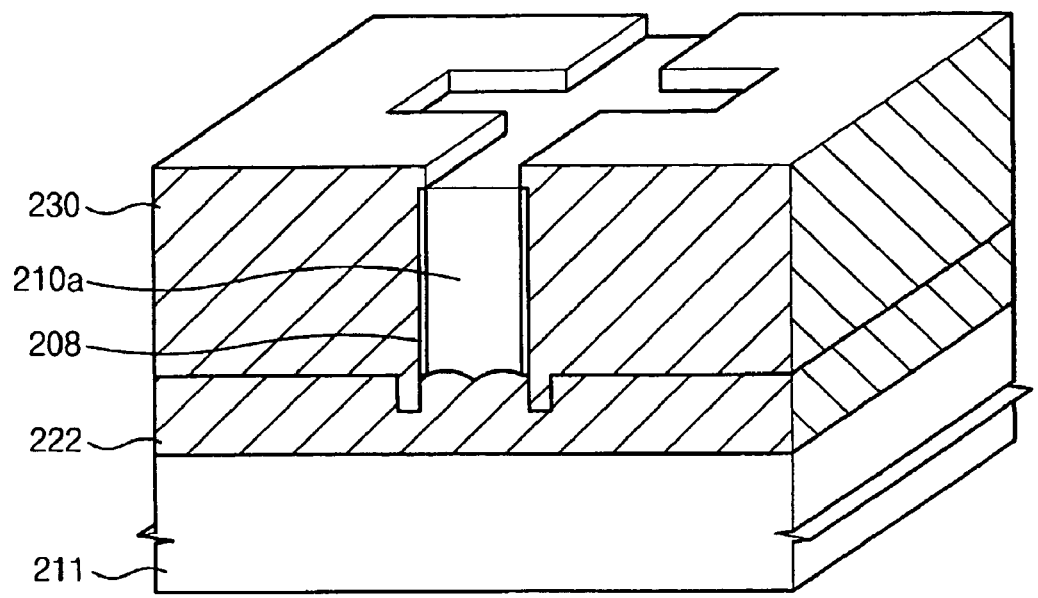

Referring now to FIG. 13E, an oxide having excellent gap-filling characteristics is deposited on the substrate 200 in the trench 206 using, for example, a CVD method, so that a trench oxide layer 230 is formed on the substrate 200. The trench oxide layer 230 is removed and planarized using, for example, a CMP process or an etch-back process, until a top surface of the nitride pattern 204 is exposed. Thus, the trench oxide layer 230 remains in the trench 206. A first wet etching process is performed using a nitride-based etchant, and thus the nitride pattern 204 is removed. A second wet etching process is performed using an oxide-based etchant, and thus the buffer oxide pattern 202 is also removed. Accordingly, the field region and the active region are separated from each other on the substrate 10.

Figure 13F:
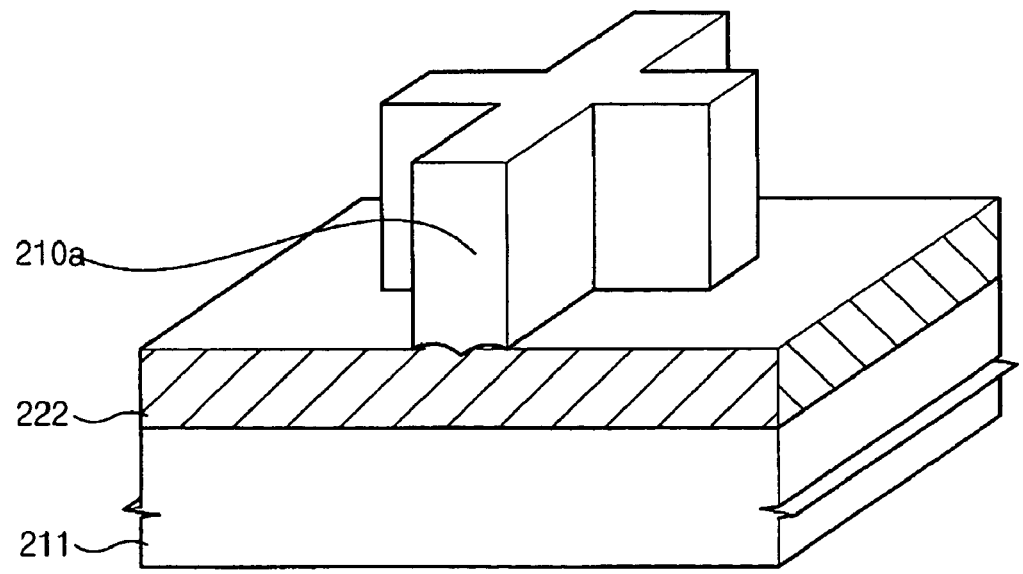

Referring now to FIG. 13F, the trench oxide layer 230 and the inner oxide layer 208 are removed, and thus the active fin 210a is protruded from the buried oxide pattern 222. A portion of the buried oxide pattern 222 may be etched away simultaneously to the etching of the trench oxide layer 230 and the inner oxide layer 208 on condition that the body portion 211 of the substrate 200 is not exposed. Accordingly, the active fin 210a is sufficiently covered with the buried oxide pattern 222 and is sufficiently isolated from the body portion 211 of the substrate 200 even though the portion of the buried oxide pattern 222 is etched away.

The trench oxide layer 230 does not need to be completely etched away, so that a portion of the trench oxide layer 230 may be etched away. An etching amount of the trench oxide layer 230 is determined in accordance with an effective thickness of the active fin 210a.

Figure 13G:
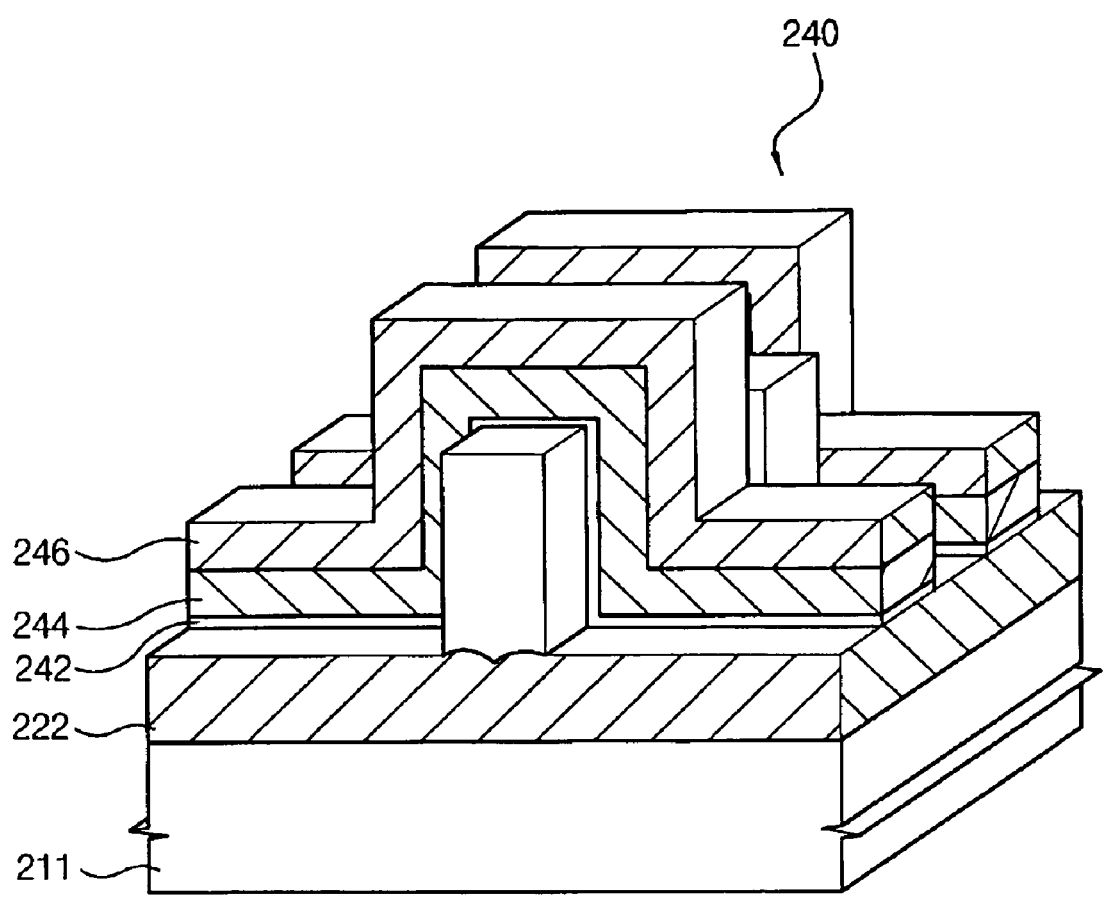

Referring now to FIG. 13G, a gate insulating layer (not shown) is formed on the buried oxide layer 222 and on a surface of the active fin 210a. A gate electrode layer (not shown) and a hard mask layer are sequentially formed on the gate insulating layer. The hard mask layer is partially removed using, for example, a conventional photolithography process to thereby form a hard mask 246, and the gate electrode layer and the gate insulating layer are sequentially etched away using the hard mask 246 as an etching mask. Accordingly, a gate structure 240 is completed including a gate insulation pattern 242, a gate electrode pattern 244 and the hard mask 246.

A conventional ion implantation process is performed on the substrate including the gate structure 240 forming source and drain regions on surface portions of the substrate symmetrically with respect to the gate structure 240. Accordingly, heat oxidation and nitride formation processes may be used to form a fin type transistor on the bulk silicon substrate, so that the fin type transistor may be formed at a relatively low cost according to some embodiments of the present invention as compared when a conventional SOI substrate is utilized for forming the fin type transistor.

As briefly discussed above with respect to FIGS. 1A through 13, according to some embodiments of the present invention, an active pattern may be formed such that some portion of the active pattern is isolated from the body portion of the substrate and another portion of the active pattern is electrically coupled to the body portion of the substrate using a heat oxidation and nitride formation processes.

Methods according to some embodiments of the present invention may reduce manufacture costs for the semiconductor devices including the active pattern. Furthermore, semiconductor device including active pattern according to some embodiments of the present invention may provide low junction capacitances, low junction leakage currents and high driving currents. Accordingly, when a cell transistor of the DRAM includes the active pattern, a data retention time of the DRAM may be increased. Finally, a portion of the active pattern may be electrically coupled to the body portion of the substrate, and thus a self-heating effect due to an operation of the semiconductor device may be significantly reduces, if not prevented. A back-bias voltage may be applied to the transistor including the active pattern, so that a threshold voltage of the transistor may be easily controllable.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor device, comprising:
    etching a semiconductor substrate such that the semiconductor substrate defines a trench and a preliminary active pattern, the trench having a floor and a sidewall;
    forming an insulating layer on the floor and the sidewall of the trench;
    forming a spacer on the insulating layer such that the spacer is on the sidewall of the trench and on a portion of the floor of the trench;
    removing the insulating layer on the floor of the trench and beneath the spacer such that a portion of the floor of the trench is at least partially exposed, the spacer is spaced apart from the floor of the trench and a portion of the preliminary active pattern is partially exposed;
    partially removing a portion of the exposed portion of the preliminary active pattern to provide an active pattern that defines a recessed portion beneath the spacer; and
    forming a buried insulating layer in the recessed portion of the active pattern.

2. The method of claim 1, wherein an upper surface of the preliminary active pattern has at least two different widths.

3. The method of claim 2:
    wherein etching the semiconductor substrate further defines a body portion of the substrate beneath the trench and the active pattern;
    wherein the active pattern includes a first region having a first width and a second region having a second width, greater than the first width; and
    wherein the buried insulating layer isolates the first region of the active pattern from the body portion of the substrate and electrically couples the second region of the active pattern to the body portion of the substrate.

4. The method of claim 2, wherein the preliminary active pattern has a first region and a second region, having a different width from the first region, and wherein partially removing the exposed portion of the preliminary active pattern comprises isotropically etching a lower portion of the first region of the preliminary active pattern.

5. The method of claim 1, wherein forming the buried insulating layer comprises forming the buried insulating layer using a thermal oxidation process or a chemical vapor deposition (CVD) process.

6. A method of forming a semiconductor device, comprising:
    etching a semiconductor substrate such that the semiconductor substrate defines a trench and a preliminary active pattern, the trench having a floor and a sidewall;
    forming an insulating layer on the floor and the sidewall of the trench;
    forming a spacer on the insulating layer such that the spacer is on the sidewall of the trench and on a portion of the floor of the trench;
    removing the insulating layer on the floor of the trench and beneath the spacer such that a portion of the floor of the trench is at least partially exposed, the spacer is spaced apart from the floor of the trench and a portion of the preliminary active pattern is partially exposed;
    partially removing a portion of the exposed portion of the preliminary active pattern to provide an active pattern that defines a recessed portion beneath the spacer; and
    forming a buried insulating layer in the recessed portion of the active pattern;
    wherein etching a semiconductor substrate further comprises:
    forming a buffer insulating layer on the semiconductor substrate;
    forming a silicon nitride layer on the buffer insulating layer;
    forming a silicon nitride pattern exposing a field region by patterning the silicon nitride layer; and
    etching the buffer insulating layer and the semiconductor substrate using the silicon nitride pattern as an etching mask to provide the trench and the preliminary active region.

7. The method of claim 1, wherein removing the insulating layer comprises isotropically etching the insulating layer using the spacer as an etching mask to thereby expose at least a portion of the surface of the trench floor.

8. The method of claim 1, wherein forming the insulating layer comprises thermally oxidizing the substrate including the preliminary active pattern.

9. The method of claim 1, wherein the insulating layer comprises silicon oxide.

10. The method of claim 1, wherein the spacer comprises silicon nitride.

11. The method of claim 1, wherein the spacer comprises a material having an etching rate lower than an etching rate of the insulating layer.

12. The method of claim 1, wherein partially removing a portion of the exposed portion of the preliminary active pattern comprises removing the portion of the exposed portion of the preliminary active pattern using a chemical dry etching process.

13. The method of claim 1, wherein forming the insulating layer further comprises forming the insulating layer such that the insulating layer extends between the preliminary active pattern and the spacer.

14. The method of claim 1, wherein forming the buried insulating layer comprises forming the buried insulating layer such that the buried insulating layer fills the recessed portion of the active pattern.

* * * * *